(12) United States Patent
Falster et al.

(10) Patent No.: US 6,986,925 B2
(45) Date of Patent: Jan. 17, 2006

(54) SINGLE CRYSTAL SILICON HAVING IMPROVED GATE OXIDE INTEGRITY

(75) Inventors: Robert J. Falster, London (GB); Vladimir V. Voronkov, Merano (IT); Paolo Mutti, Milan (IT); Francesco Bonoli, Novara (IT)

(73) Assignee: MEMC Electronic Materials, Inc., St. Peters, MO (US)

( * ) Notice: Subject to any disclaimer, the term of this patent is extended or adjusted under 35 U.S.C. 154(b) by 367 days.

(21) Appl. No.: 10/039,196

(22) Filed: Jan. 2, 2002

(65) Prior Publication Data

US 2002/0121238 A1 Sep. 5, 2002

Related U.S. Application Data

(60) Provisional application No. 60/259,362, filed on Jan. 2, 2002.

(51) Int. Cl.
*B32B 3/02* (2006.01)

(52) U.S. Cl. .................. 428/64.1; 428/64.4; 117/13; 117/20; 117/932

(58) Field of Classification Search .............. 428/64.1, 428/64.4; 117/13, 20, 932
See application file for complete search history.

(56) References Cited

U.S. PATENT DOCUMENTS

| | | | |
|---|---|---|---|
| 5,502,010 A | 3/1996 | Nadahara et al. | |
| 5,919,302 A | 7/1999 | Falster et al. | 117/3 |
| 5,994,761 A | 11/1999 | Falster et al. | 257/611 |
| 6,162,708 A * | 12/2000 | Tamatsuka et al. | 438/503 |
| 6,180,220 B1 | 1/2001 | Falster et al. | 428/312.6 |
| 6,191,010 B1 | 2/2001 | Falster | 428/471 |
| 6,254,672 B1 | 7/2001 | Falster et al. | 117/13 |
| 6,287,380 B1 | 9/2001 | Falster et al. | 117/13 |
| 6,336,968 B1 | 1/2002 | Falster | 117/2 |
| 6,485,807 B1 * | 11/2002 | Park | 428/64.1 |

FOREIGN PATENT DOCUMENTS

| | | |
|---|---|---|
| WO | WO 98/45507 A1 | 10/1998 |
| WO | WO 98/45507 * | 10/1998 |
| WO | WO 00/00675 A1 | 1/2000 |

OTHER PUBLICATIONS

R. Falster "The Phenomenology of Dielectric Breakdown in Thin Silicon Dioxide Films: Al Cathodes and p-type Si Anodes" J. Appl. Phys., vol. 66. No. 7 (1989) pp. 3355–3370.

R. Falster et al. "On the Properties of the Intrinsic Point Defects in Silicon: A Perspective from Crystal Growth and Wafer Processing" Phys. Stat Sol. (b). vol. 222. No. 1 (2000) pp. 219–244.

(Continued)

*Primary Examiner*—Harold Pyon
*Assistant Examiner*—Jane Rhee
(74) *Attorney, Agent, or Firm*—Senniger Powers

(57) ABSTRACT

A single crystal silicon wafer comprising a front surface, a back surface, a lateral surface joining the front and back surfaces, a central axis perpendicular to the front and back surfaces, and a segment which is axially symmetric about the central axis extending substantially from the front surface to the back surface in which crystal lattice vacancies are the predominant intrinsic point defect, the segment having a radial width of at least about 25% of the radius and containing agglomerated vacancy defects and a residual concentration of crystal lattice vacancies wherein (i) the agglomerated vacancy defects have a radius of less than about 70 nm and (ii) the residual concentration of crystal lattice vacancy intrinsic point defects is less than the threshold concentration at which uncontrolled oxygen precipitation occurs upon subjecting the wafer to an oxygen precipitation heat treatment.

27 Claims, 17 Drawing Sheets

OTHER PUBLICATIONS

T. Sinno et al. "Point Defect Dynamics and the Oxidation–Induced Stacking–Fault Ring in Czochralski–Grown Silicon Crystals" J. Electrochem. Soc., vol. 145, No. 1 (1998) pp. 302–318.

A. Virzi "Computer Modelling of Heat Transfer in Czochralski Silicon Crystal Growth" J. of Crystal Growth, vol. 112, No. 4 (1991) pp. 699–722.

V. Voronkov et al. "Grown–in Microdefects, Residual Vacancies and Oxygen Precipitation Bands in Czochralski Silicon" J. of Crystal Growth, vol. 204 (1999) pp. 462–474.

V. Voronkov et al. "Vacancy and Self–interstitial Concentration Incorporated into Growing Silicon Crystals" J. of Applied Physics, vol. 86, No. 11 (1999) pp. 2975–2982.

V. Voronkov et al. "Vacancy–type Microdefect Formation in Czochralski Silicon" J. of Crystal Growth, vol. 194 (1998) pp. 76–88.

Partial International Search for analogous PCT application Serial No. PCT/US02/01127 dated Sep. 9, 2002.

* cited by examiner

Field dependent breakdown: get more information by changing ramp rate

SINGLE CRYSTAL SILICON HAVING IMPROVED GATE OXIDE INTEGRITY

BACKGROUND OF THE INVENTION

In general, the present invention relates to the preparation of a single crystal silicon ingot according to the Czochralski method. In particular, the invention relates to a high throughput process for preparing single crystal silicon wafers having improved gate oxide integrity, wherein the growth conditions of a single crystal silicon ingot, from which the wafers are derived, are controlled. More specifically, the growth conditions of a single crystal silicon ingot, including the growth velocity, the average axial temperature gradient and the cooling rate, are controlled in order to limit the size, and in some cases the density, of vacancy-related agglomerated defects, and optionally the residual vacancy concentration, in single crystal silicon wafers derived therefrom. Additionally, the present invention relates to a more accurate and reliable method by which to evaluate the gate oxide integrity of such wafers.

Single crystal silicon, which is the starting material in most processes for the fabrication of semiconductor electronic components, is commonly prepared by the so-called Czochralski ("Cz") method. In this method, polycrystalline silicon ("polysilicon") is charged to a crucible and melted, a seed crystal is brought into contact with the molten silicon, and then a single crystal is grown by slow extraction. After formation of a neck is complete, the diameter of the crystal is enlarged by, for example, decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process but before the crucible is emptied of molten silicon, the crystal diameter is typically reduced gradually to form a tail end in the form of an end-cone. The end-cone usually is formed by increasing the crystal pull rate and heat supplied to the crucible. When the diameter becomes small enough, the crystal is then separated from the melt.

In recent years, it has been recognized that a number of defects in single crystal silicon form in the growth chamber as the ingot cools from the temperature of solidification. More specifically, as the ingot cools intrinsic point defects, such as crystal lattice vacancies or silicon self-interstitials, remain soluble in the silicon lattice until some threshold temperature is reached, below which the given concentration of intrinsic point defects becomes critically supersaturated. Upon cooling to below this threshold temperature, a reaction or agglomeration event occurs, resulting in the formation of agglomerated intrinsic point defects.

The type and initial concentration of these intrinsic point defects in the silicon are determined as the ingot cools from the temperature of solidification (i.e., about 1410° C.) to a temperature greater than about 1300° C. (i.e., about 1325° C., 1350° C. or more); that is, the type and initial concentration of these defects are controlled by the ratio $v/G_0$, where v is the growth velocity and $G_0$ is the average axial temperature gradient over this temperature range. In general, a transition from self-interstitial dominated growth to vacancy dominated growth occurs near a critical value of $v/G_0$ which, based upon currently available information, appears to be about $2.1 \times 10^{-5} cm^2/sK$, where $G_0$ is determined under conditions in which the axial temperature gradient is constant within the temperature range defined above. Accordingly, process conditions, such as growth rate (which affect v), as well as hot zone configurations (which affect $G_0$), can be controlled to determine whether the intrinsic point defects within the silicon single crystal will be predominantly vacancies (where $v/G_0$ is generally greater than the critical value) or self-interstitials (where $v/G_0$ is generally less than the critical value).

Defects associated with the agglomeration of crystal lattice vacancies, or vacancy intrinsic point defects, include such observable crystal defects as D-defects, Flow Pattern Defects (FPDs), Gate Oxide Integrity (GOI) Defects, Crystal Originated Particle (COP) Defects, and crystal originated Light Point Defects (LPDs), as well as certain classes of bulk defects observed by infrared light scattering techniques (such as Scanning Infrared Microscopy and Laser Scanning Tomography). Also present in regions of excess vacancies are defects which act as the nuclei for the formation of oxidation induced stacking faults (OISF). It is speculated that this particular defect is a high temperature nucleated oxygen precipitate catalyzed by the presence of excess vacancies.

Agglomerated defect formation generally occurs in two steps; first, defect "nucleation" occurs, which is the result of the intrinsic point defects, such as vacancies, being supersaturated at a given temperature. Once this "nucleation threshold" temperature is reached, intrinsic point defects, such as vacancies, start to agglomerate (i.e., void formation begins). The intrinsic point defects will continue to diffuse through the silicon lattice as long as the temperature of the portion of the ingot in which they are present remains above a second threshold temperature (i.e., a "diffusivity threshold"), below which intrinsic point defects are no longer mobile within commercially practical periods of time. While the ingot remains above this temperature, vacancy intrinsic point defects, for example, diffuse through the crystal lattice to sites where agglomerated vacancy defects, or voids, are already present, effectively causing a given agglomerated defect to grow in size. This is because these agglomerated defect sites essentially act as "sinks," attracting and collecting vacancy intrinsic point defects because of the more favorable energy state of the agglomeration. Accordingly, the formation and size of such agglomerated defects are dependent upon the growth conditions, including $v/G_0$ (which impacts the initial concentration of such point defects) and the cooling rate or residence time of the main body of the ingot over the range of temperatures bound by the "nucleation threshold" at the upper end and the "diffusivity threshold" (which impacts the size and density of such defects) at the lower end.

Maximizing throughput is a primary concern in the cost-effective production of single crystal silicon wafers. As a result, growing single crystal silicon ingots at the highest possible growth rates is the goal for all silicon manufacturers. However, until now, there has generally been no clear way to produce single crystal silicon of an acceptable quality using such growth conditions. For example, high pull rates/cooling rates typically mean a high vacancy concentration, which leads to a high concentration of small, agglomerated defects. Such conditions are favorable, for example, with respect to light point defects (LPDs) because integrated circuit manufacturers typically require that the number of such defects in excess of about 0.2 microns in size not exceed about 20 for a 200 mm diameter wafer. However, such conditions are also unfavorable because they have traditionally been considered to yield wafers having poor gate oxide integrity. In contrast, when slower pull rates/ cooling rates are employed as a means by which to improve GOI (slow cooling typically resulting in a few, very large agglomerated vacancy defects being formed), the resulting size of LPDs is unacceptable.

An additional area of concern, with respect to high pull rates/cooling rates, is the residual vacancy concentration. More specifically, high pull rates typically lead to high vacancy concentrations in the silicon that is formed, and well as high cooling rates. High cooling rates, in turn, typically lead to a high residual vacancy concentration (i.e., the concentration of silicon lattice vacancies present in the silicon, once it has cooled to a temperature at which vacancies are essentially no longer mobile). High residual vacancy concentrations are problematic because, upon subsequent heating, they can lead to uncontrolled oxygen precipitation.

Accordingly, a need continues to exist for a method by which single crystal silicon ingots may be grown by the Czochralski process under conditions which maximize not only throughput, but also the yield of the silicon wafers obtained therefrom. Such a process would optimize growth conditions such that the fastest possible pull rate of a given crystal puller could be employed, in view of the need to limit the size, and in some cases the density, of agglomerated vacancy defects, as well as the residual vacancy concentration.

SUMMARY OF THE INVENTION

Among the several features of the present invention therefore is the provision of a single crystal silicon ingot, from which a single crystal silicon wafer may be obtained, having improved gate oxide integrity, and a process for the preparation thereof; the provision of such a process wherein the highest possible pull rates, for a given crystal puller, can be employed, thus maximizing throughput and yield; the provision of such a process wherein growth conditions are controlled to limit the size of agglomerated vacancy defects formed; the provision of such a process wherein the density of agglomerated vacancy defects is controlled; and, the provision of such a process wherein the residual vacancy concentration is limited to avoid uncontrolled oxygen precipitation.

Briefly, therefore, the present invention is directed to a process for growing a single crystal silicon ingot in which the ingot comprises a central axis, a seed-cone, a tail end, and a constant diameter portion between the seed-cone and the tail end having a lateral surface and a radius extending from the central axis to the lateral surface, the ingot being grown from a silicon melt and then cooled from the solidification temperature in accordance with the Czochralski method. The process comprises: (i) controlling a growth velocity, v, and an average axial temperature gradient, $G_0$, during the growth of the constant diameter portion of the crystal to form a segment which is axially symmetric about the central axis in which crystal lattice vacancies are the predominant intrinsic point defect, the segment having a radial width of at least about 25% of the radius; and, (ii) cooling the ingot to form in the axially symmetric segment agglomerated vacancy defects and a residual concentration of crystal lattice vacancy intrinsic point defects, wherein the agglomerated vacancy defects have an average radius of less than about 70 nm and the concentration of residual crystal lattice vacancy intrinsic point defects is less than the threshold concentration at which uncontrolled oxygen precipitation occurs upon subjecting the cooled segment to an oxygen precipitation heat treatment.

The present invention is further direct to a single crystal silicon wafer comprising a front surface, a back surface, a lateral surface joining the front and back surfaces, a central axis perpendicular to the front and back surfaces, and a segment which is axially symmetric about the central axis extending substantially from the front surface to the back surface in which crystal lattice vacancies are the predominant intrinsic point defect, the segment having a radial width of at least about 25% of the radius and containing agglomerated vacancy defects and a residual concentration of crystal lattice vacancies, wherein (i) the agglomerated vacancy defects have an average radius of less than about 70 nm, and (ii) the residual concentration of crystal lattice vacancy intrinsic point defects is less than the threshold concentration at which uncontrolled oxygen precipitation occurs upon subjecting the wafer to an oxygen precipitation heat treatment.

The present invention is still further direct to a single crystal silicon wafer comprising a front surface, a back surface, a lateral surface joining the front and back surfaces, a central axis perpendicular to the front and back surfaces, and a segment which is axially symmetric about the central axis extending substantially from the front surface to the back surface in which crystal lattice vacancies are the predominant intrinsic point defect, the segment having a radial width of at least about 25% of the radius and containing agglomerated vacancy defects and a residual concentration of crystal lattice vacancies, wherein (i) the agglomerated vacancy defects have an average radius of less than about 70 nm, and (ii) upon being subjected to a rapid thermal anneal, wherein the wafer is rapidly heated to a temperature of about 1200° C. in the essential absence of oxygen and then cooled, and then subjected to an oxygen precipitation heat treatment, consisting essentially of annealing said wafer at 800° C. for about 4 hours and then at about 1000° C. for about 16 hours, the concentration of oxygen precipitates formed will be less than about $1 \times 10^8$ cm$^{-3}$.

The present invention is further direct to a method of evaluating gate oxide integrity of a population of single crystal silicon wafers. The method comprises (i) determining the dielectric breakdown characteristics of a first subset of said population as a function of the amount of stress applied to the first subset wherein the amount of stress is increased at a first rate from an initial value to a final value, (ii) determining the dielectric breakdown characteristics of a second subset of said population as a function of the amount of stress applied to the second subset wherein the amount of stress is increased at a second rate from an initial value to a final value and the second rate is different from the first rate, and (iii) using the dielectric breakdown characteristics determined in steps (i) and (ii) to predict the gate oxide failure rate at a given electric field for the population.

Other objects and features of the present invention will be in part apparent and in part pointed out hereinafter.

BRIEF DESCRIPTION OF THE DRAWINGS

FIG. 12 illustrates a Weibull view of the size effect of voids on the dielectric breakdown distribution (for normal, or high density, and slow cooled, or low density, material).

FIG. 13 illustrates the predicted reliability from ramp test data for standard (lower curve) and slow cooled (upper curve) material (21 nm oxide; prediction for 5 V room temperature operation).

FIG. 15 illustrates the predicted reliability from ramp test data comparing standard and fast cooled void types (21 nm oxide; prediction from 5 V room temperature operation).

FIG. 18 is a graph illustrating the relationship between void size, void density and residual vacancy space as a function of the incorporated vacancy concentration, $S_0$, normalized to the melting point concentration, and cooling rate (void density, $N_v$, shown at $1 \times 10^5$ cm$^{-3}$, $1 \times 10^6$ cm$^{-3}$, $1 \times 10^7$ cm$^{-3}$ and $1 \times 10^8$ cm$^{-3}$; residual vacancy concentration, $C_{res}$, shown at $1 \times 10^{12}$ cm$^{-3}$, $3 \times 10^{12}$ cm$^{-3}$ and $1 \times 10^{13}$ cm$^{-3}$; and, void radius, $R_v$, shown at 30 nm and 15 nm).

FIG. 19 is a graph illustrating an exemplary "window" of operating conditions under which "useful, functionally perfect" silicon can be formed under a standard growth model, and assuming a constant cooling rate is employed (void density, $N_v$, shown at $1 \times 10^5$ cm$^{-3}$, $1 \times 10^6$ cm$^{-3}$, $1 \times 10^7$ cm$^{-3}$ and $1 \times 10^8$ cm$^{-3}$; residual vacancy concentration, $C_{res}$, shown at $1 \times 10^{12}$ cm$^{-3}$, $3 \times 10^{12}$ cm$^{-3}$ and $1 \times 10^{13}$ cm$^{-3}$; and, void radius, $R_v$, shown at 30 nm and 15 nm).

FIG. 20 is a graph illustrating an exemplary "window" of operating conditions under which "useful, functionally perfect" silicon can be formed under a modified growth model, wherein a two-stage cooling rate is employed (void density, $N_v$, shown at $1 \times 10^4$ cm$^{-3}$, $1 \times 10^5$ cm$^{-3}$, $1 \times 10^6$ cm$^{-3}$, $1 \times 10^7$ cm$^{-3}$ and $1 \times 10^8$ cm$^{-3}$; residual vacancy concentration, $C_{res}$, shown at $3 \times 10^{12}$ cm$^{-3}$ and $1 \times 10^{13}$ cm$^{-3}$; and, void radius, $R_v$, shown at 30 nm and 15 nm).

DETAILED DESCRIPTION OF THE PREFERRED EMBODIMENTS

Based upon experimental evidence to-date, it appears that presently accepted practices for determining gate oxide integrity in single crystal silicon wafers are inaccurate and, as a result, lead to the disposal and therefore waste of wafers which would otherwise be acceptable for use. More specifically, gate oxide integrity requirements are typically presented in terms of a percent failure at a given electrical field, a field which is substantially greater than the field at which the integrated circuit will be operated (e.g., 2×, 3×, 4×, etc. the operating field). As further explained below, such tests can and, it is now believed, do result in the rejection of material which is acceptable for use. This waste is primarily the result of a test which erroneously leads to the conclusion that a few, large agglomerated defects in a given wafer are preferable to a number of, in comparison, relatively small defects.

Accordingly, the present invention enables more wafers to be obtained from a given single crystal silicon ingot by engineering void size, in some cases irrespective of density, by controlling growth conditions (including growth velocity, v, and the average axial temperature gradient, $G_0$, as defined herein), as well as the cooling rate of the ingot within certain temperature ranges during the growth process, in order to meet well-defined failure distribution requirements (i.e., GOI requirements) in both field and time. Additionally, the cooling rate may be controlled to avoid residual vacancy concentrations which are so high that a massive catalysis of subsequent oxygen clustering reactions occurs. Avoiding such reactions is preferred because such vacancy-catalyzed oxygen clusters can and usually do grow large enough in the crystal growth process that they cannot be eliminated by subsequent thermal treatments (such as, for example, the processes described in U.S. Pat. No. 5,994,761 and PCT/US99/19301, both of which are incorporated herein by reference). As a result, oxygen precipitation performance of such wafers runs out of control, preventing the formation of a denuded zone under ordinary conditions; that is, if the residual vacancy concentration is too high, a wafer subjected to the thermal processes described in U.S. Pat. No. 5,994,761 and PCT/US99/19301 would not yield the desired result.

Gate Oxide Integrity Determination

Figure 1:
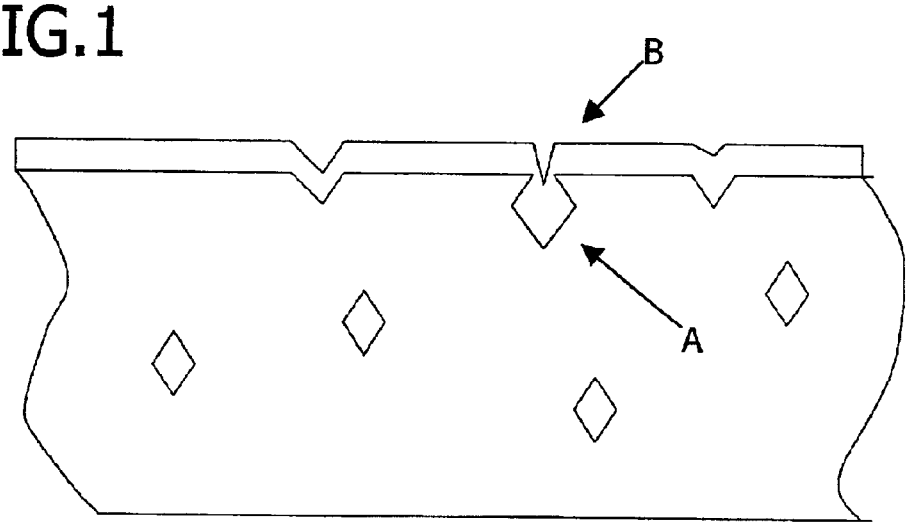
FIG. 1 is a schematic of a cross-section of a segment of a single crystal silicon wafer having an oxide layer deposited on the surface thereof, showing in exaggerated detail voids (denoted "A") at the surface which result in weak spots (denoted "B") in the oxide layer.

Referring now to FIG. 1, voids, or agglomerated vacancy defects, which intersect the silicon-silicon dioxide interface (denoted "A") create "weak spots" (denoted "B") in the gate oxide, resulting in dielectric breakdown events that occur at electric fields generally lower than what is expected from a void-free interface. The presence of these "weak spots" in the gate oxide has been a primary issue of concern for silicon material performance for about the past ten years. Recently, progress has been made in understanding the detailed nature of void-related breakdown distributions, in both electric field and stress-time, as a function of void size distribution and oxide thickness. This progress has led to a variety of important conclusions which are described further herein, and which serve as the basis for the present invention.

Figure 2:
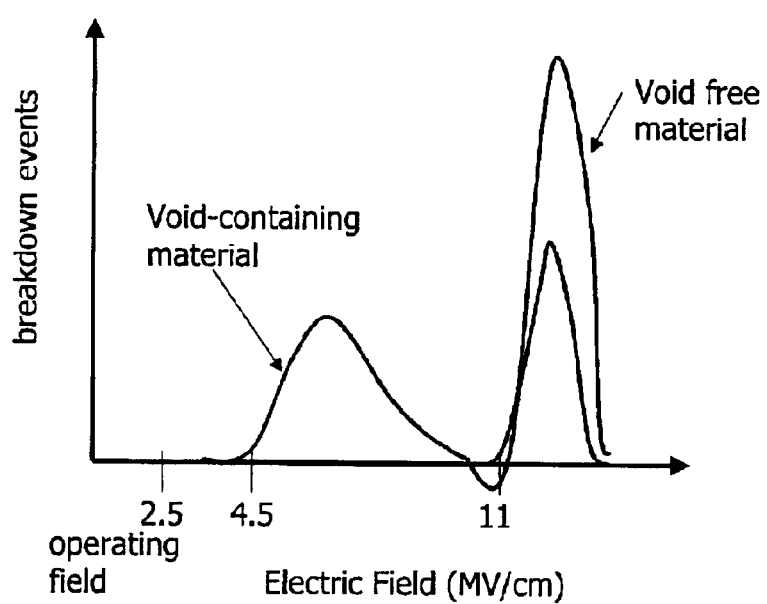
FIG. 2 is a schematic diagram which illustrates a typical dielectric breakdown distribution in void-containing and void-free silicon in a ramped field test.

Dielectric Breakdown and Material Reliability—Void-related Dielectric Breakdown:

Referring now to FIG. 2, a schematic diagram illustrating typical distributions of breakdown events in void-containing silicon and void-free silicon (e.g., epitaxial, substantially defect-free or interstitial type silicon) are shown. This diagram illustrates exemplary results in a system with a 20 nm gate oxide with a relatively large capacitor sampling area (about 0.1 cm²). Dielectric breakdown tests offer movable "windows" for the distributions of faults in any given system. The relative position of the "window" with respect to the defect of interest is determined by the product of the density of this defect and the capacitor area. If the product is too large or small, essentially nothing is observed. Accordingly, in the schematic illustrated in FIG. 2, it has been assumed that the optimal case has been selected.

The effect of the voids in the dielectric breakdown test is to create a peak of breakdown events in the mid-field range. Additionally, there is a second class of defects, denoted by a second peak, beyond the void-related failure peak, which is responsible for the distribution of breakdown events at higher fields. It is this second class, or mode, of breakdown which completes the breakdown process for all devices. This mode is found to be common for essentially all types of material, including defect-free material (e.g., epitaxial silicon), and is due to an effect unrelated to voids. Accordingly, this is generally not a practically important material characteristic for the present invention and therefore will not be discussed further; that is, for purposes of the present invention, we are concerned solely with the first peak.

The presence of this first peak implies that void-related breakdown is a finite effect. The simple reason for this is that there is a limited number of countable voids in any given sample. By the time the electric field reaches values higher than that of the end of second peak, all of the voids in the system have been "turned on;" that is, all of the voids have been transformed from a real physical "defect" (i.e., a void) into an observable electrical defect (i.e., a breakdown site). The integral of electrically detected defects under the peak is equal to the total number of physical voids intersecting the interface.

The reason for this distribution in field of electrical faults resulting from voids (i.e., the width of the peak) is believed to be a combination of scatter in actual void size and, more importantly, scatter in the cross-section of the void-interface intersection resulting from both the size and spatial distribution of the voids. It will be seen that the shape of the peak of the material of the present invention (in addition to simply the average value) is a significant parameter in material reliability.

Breakdown Requirements And Material Screening:

Semiconductor device manufacturers are generally concerned with two questions: (i) what is the yield of devices, and (ii) what is the reliability of the devices overtime; in other words, device manufacturers are concerned with how many defective pieces are found in short tests of operation (i.e., "yield"), and how many defective pieces will subsequently develop over the life of a device (i.e., "reliability"). These questions require further clarification; for instance, one must consider what are the operating conditions of the device and what are the allowed levels of defectiveness as a function of time. Initially, if some generally standard answers to these questions are assumed, the operating field would be about 2.5 MV/cm (for 20 nm oxide and 5V $V_{dd}$) and a single bit fail would result in a defective chip. After yield screening, it is the reliability requirements that are important. For example, in stringent automotive applications, it is typically required that the failure rate be less than 1 ppm fail in 10 years.

Data such as that shown in FIG. 2, however, actually does not provide much help in coming to conclusions about any of these questions; FIG. 2 shows no breakdown events at the operating field (2.5 MV/cm). This means that the yield of operating devices derived from both void-containing and void-free material when evaluated at this operating field is actually about 100%. Stated more stringently, this number must be considered within the context of a defined statistical "confidence limit" but, even taking this into consideration, this number should not be significantly different than about 100% in view of such data.

In reality, however, one hundred percent of the void-containing and void-free material will not be free of defects. In an attempt to deal with yield and reliability, therefore, semiconductor device manufacturers have subjected the manufactured semiconductor devices, e.g., capacitors, to fields which are significantly greater than the operating field. This approach, sometimes referred to the "burn-in" test, is a standard part of integrated circuit testing. It is only under such tests that failure due to voids is seen and becomes important. Referring again to FIG. 2, it can be seen that applying 10V instead of 5V moves one directly into the middle of the void failure distribution. The basic reasoning behind this standard procedure is the belief that, by eliminating parts defective at fields higher than the operating field, one will have succeeded in eliminating weak spots which would have failed at the operating field during the expected life of operation.

One of the limitations of the burn-in test is that is carried out on the finished semiconductor devices. It cannot, therefore, be used to identify silicon wafers which have a high-probability of yielding semiconductor devices which, if used in a semiconductor device manufacturing process, would produce semiconductor devices having a high incidence of burn-in failure. In an effort to pre-screen silicon wafers for this purpose, semiconductor device manufacturers have subjected silicon wafers to various gate oxide integrity tests, such as ramped field tests (e.g., "BVOX", wherein the percent pass might be 20%, 70%, etc. up to a given field, such as 8 mV) or the "QBD" test. In principle, however, these tests are equivalent to the "burn-in" test in the sense that the wafers are subjected to an electric field which is arbitrarily selected.

The issue is thus one of correlating the "burn-in" field or equivalent test to the performance specification. Stated another way, the field which actually and effectively identifies, and thus screens, those devices that would fail in the required lifetime of the device, down to the level of the specification (e.g., 1 ppm), without unnecessarily throwing away those devices that would actually have survived must be determined. To determine this, one needs to have reliable information about the time-dependence of the failure mechanism resulting from the particular class of defect for which one is screening. This information then needs to be coupled to the specific field dependence of the distribution with which one is dealing. Until now, this has not been done; rather, only standard, "rule of thumb" approaches have been used to-date. As a result, it can be concluded that: (i) the burn-in field is a largely arbitrarily chosen stress level which, it is hoped, will successfully screen devices in order to reduce the failure rate of devices sold by the integrated circuit manufactures to acceptable levels; and, (ii) the BVOX requirement is based on an equally arbitrarily chosen field (a field larger than the burn-in field), in which the hope is that this screening will produce an acceptable level of success (i.e., yield) through the burn-in test. The problem gets compounded even more when these already arbitrary conditions are then applied to arbitrarily different circumstances, such as different oxide thicknesses.

Figure 3:
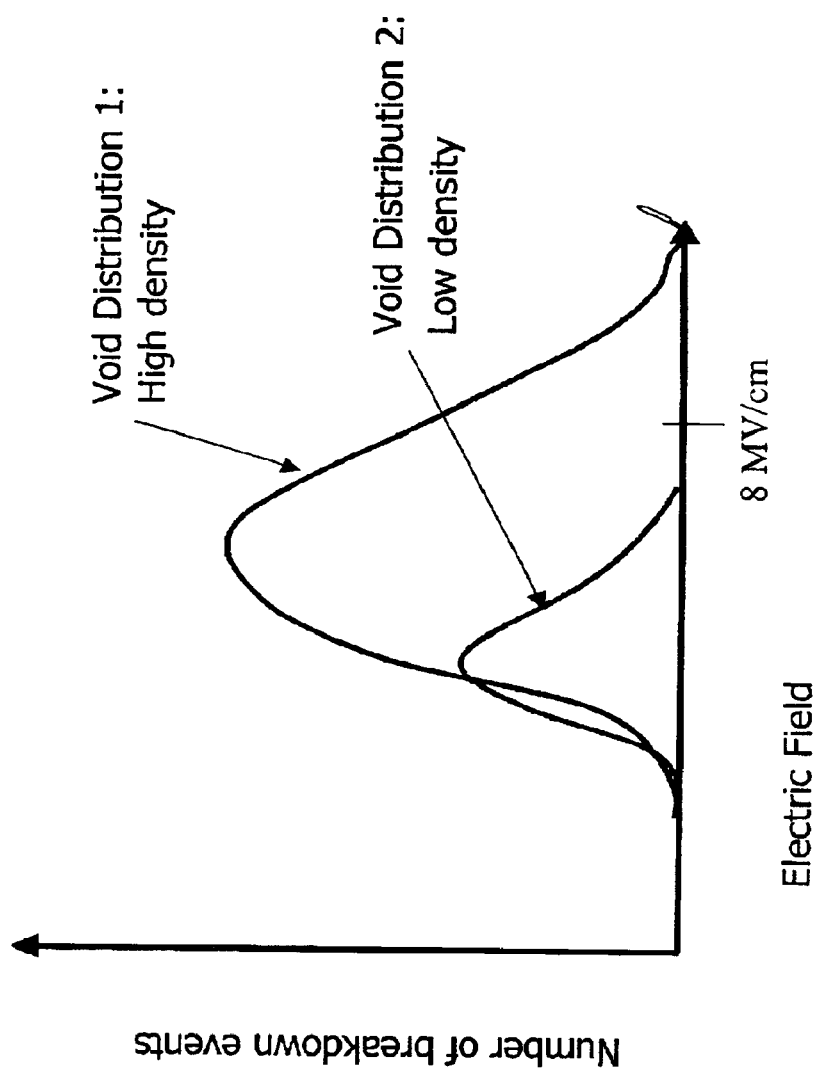
FIG. 3 is a schematic diagram comparing the dielectric breakdown distributions of a "normal" (or high density) void-containing silicon wafer and an "improved" slow cooled (or low density) silicon wafer; the total integrated number of breakdown events up to the arbitrarily defined test field of 8 MV/cm being lower for the slow cooled crystal (which contains a lower number density of voids).

Applying these standard tests, if the results of "normal" void-containing material are compared to what is conventionally considered to be an "improved" material (i.e., lower void density, slow cooled material), the slow-cooled material appears to be superior. For example, FIG. 3 shows in a schematic way typical examples of the experimentally-determined, void-related part of the breakdown distribution of the two types of material. The effective oxide defect density, as determined by BVOX testing (purely a matter of definition, rather than an absolute number), scales approximately with the void density in the silicon in most BVOX type tests; but it need not.

In view of FIG. 3, it can be seen that the slow cooled material has a total number of void-related breakdown events which is less than the standard material. This is because slow cooling produces a lower number density of voids, as is commonly understood and expected. Furthermore, however, it should be noted that there is a shift in the average field of the distribution between the two groups.

The "yield" of slow cooled material is generally better than standard material, based on the assumption that the device under consideration is statistically sensitive at all to the problem (which is a question of the relationship of total gate area and effective defect density; i.e., the "window" problem described herein). Additionally, the material which is essentially free of such agglomerated defects (e.g., epitaxial silicon, or alternatively "low defect density silicon," as described in PCT/US98/07365 and PCT/US98/07304 which are incorporated herein by reference) is generally better than them both. However, such a conclusion is based entirely upon the field chosen for the test to define the yield which, as noted above, has been selected somewhat arbitrarily to-date. For example, in the present case, if the field is changed from 8 to 4 MV/cm, then all three types of silicon appear to be acceptable. Additionally, at a slightly larger field, the performances of the slow cooled and standard materials are actually reversed. All of this leads one to question just what is actually the best way to define material quality.

Breakdown Statistics:

To resolve this issue, and ultimately determine the best way to evaluate the silicon material for performance, statistical methods have been employed here. The purpose of such an approach is to predict the time dependence of device failure in a system with a given set of defects at a given stress level, and then to assess the effectiveness of the "screening" of the device distribution by a particular burn-in procedure. The stress level of interest is the operating field (e.g., 2.5 mV/cm) and the failure requirements are for extremely low failure rates over very long times (e.g., failure of 1 ppm/10 years). Clearly, a coherent method is needed to extrapolate data which can be taken in a convenient and cost effective way, and this involves the application of statistics.

The first basic assumption is that defects are randomly distributed. Thus, Poisson statistics are employed. "Yield" is simply the probability of not finding a defect in a group of samples. These defects have a density D and the samples (i.e., capacitors) have an individual area A. The yield is given by equation(1):

$$Y=1-F=\exp(-AD) \qquad (1)$$

where Y is yield and F is the number of failures.

The cause of the electrical defects of interest are voids that intersect the wafer surface. They have an area density approximately equal to their volume density, p, times their average diameter, d. Since the oxide thicknesses of interest are generally small, ranging for example from a few nanometers (e.g., 2, 4, 6, etc.) to a few tens of nanometers (e.g., 10, 20, 30, etc.), compared to the amount of silicon consumed during the oxidation process, it is believed to be reasonable to ignore this small correction here.

It is important to keep in mind that dielectric breakdown tests do not detect voids, rather they detect oxide failures. The only physical or potential defect density is pd. This is not equal to D in the above expression; rather, D is the electrical defect density which is something different from the void density. A physical defect only becomes an electrical defect when it is "turned-on" by electrical stress. In order to describe and utilize data from electrical stress tests, an approximate mathematical form is needed for this conversion from physical defect to electrical defect.

Constant Field Or Current Stress:

There are two main stress variables for the case of dielectric breakdown: electric field (or current) and time. The Weibull approach to this statistical problem assumes a simple power law relation for whatever variable is under test, which usually means just time. However, our case is slightly more complicated than the usual case, in that it is a two-parameter distribution and combines two different power laws for each variable. In this regard, it is to be noted that the Weibull distribution makes no claim to describing or modeling any physical mechanism; rather, it is just a statistical method and a simple, useful and powerful way of dealing with complex data.

To begin then, first consider the simplest kind of applied stress, that of constant field stress E. For this case, the Weibull description of the increase of effective defect density with time is shown in equations (2) and (3):

$$AD = Ct^a E^b \tag{2}$$

and thus $$1-F = \exp(-Ct^a E^b). \tag{3}$$

The density and probe area are contained in the "C" parameter, the field dependence in the "b" and the time dependence in the "a" parameter (where t=time). These parameters are easily obtained by taking a double logarithm of yield data and plotting this against the logarithm of time. The "Weibull" plot is thus expressed in equation (4):

$$\ln(-\ln(1-F)) = a\ln(t) + b\ln(E) + \ln C. \tag{4}$$

This is a simple linear, and hence useful, equation in ln(t), and it appears to works well in describing the experimental data. The number ln(-ln(1-F)) is referred to as the Weibull number.

Figure 4:
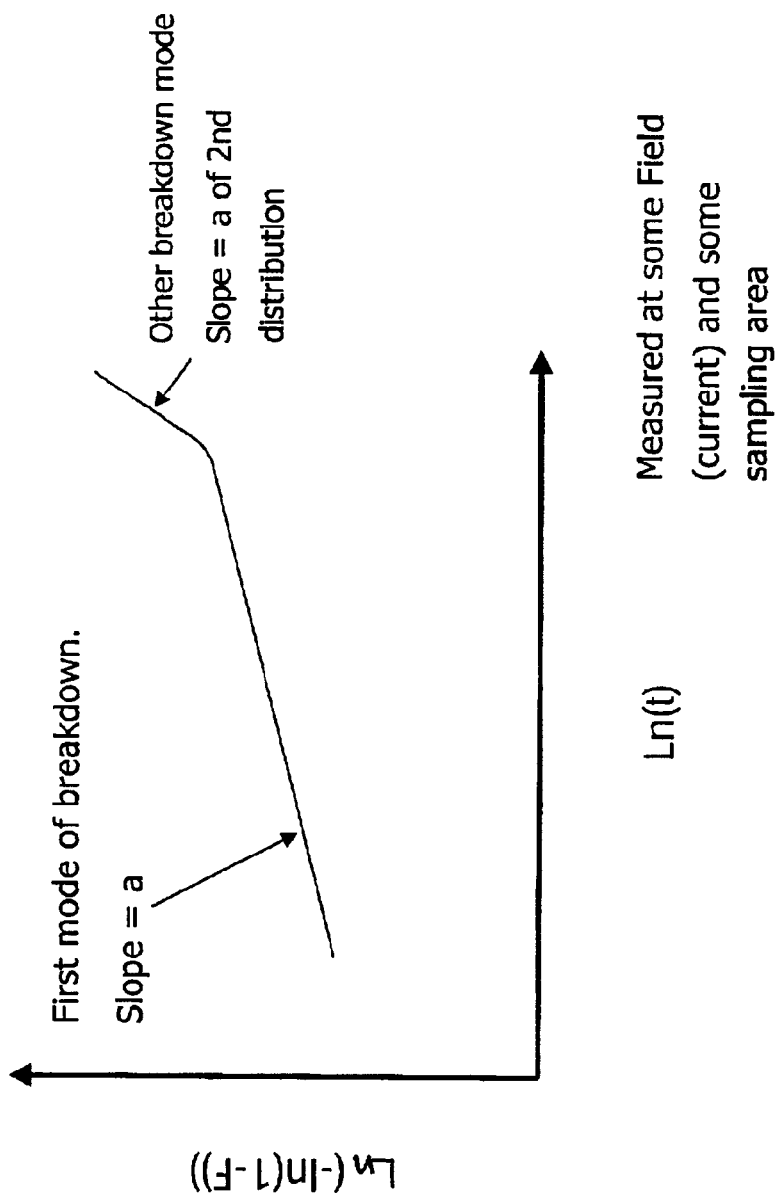
FIG. 4 is a schematic diagram illustrating the Weibull representation of dielectric breakdown failures in a constant field (or current) test.
Figure 5:
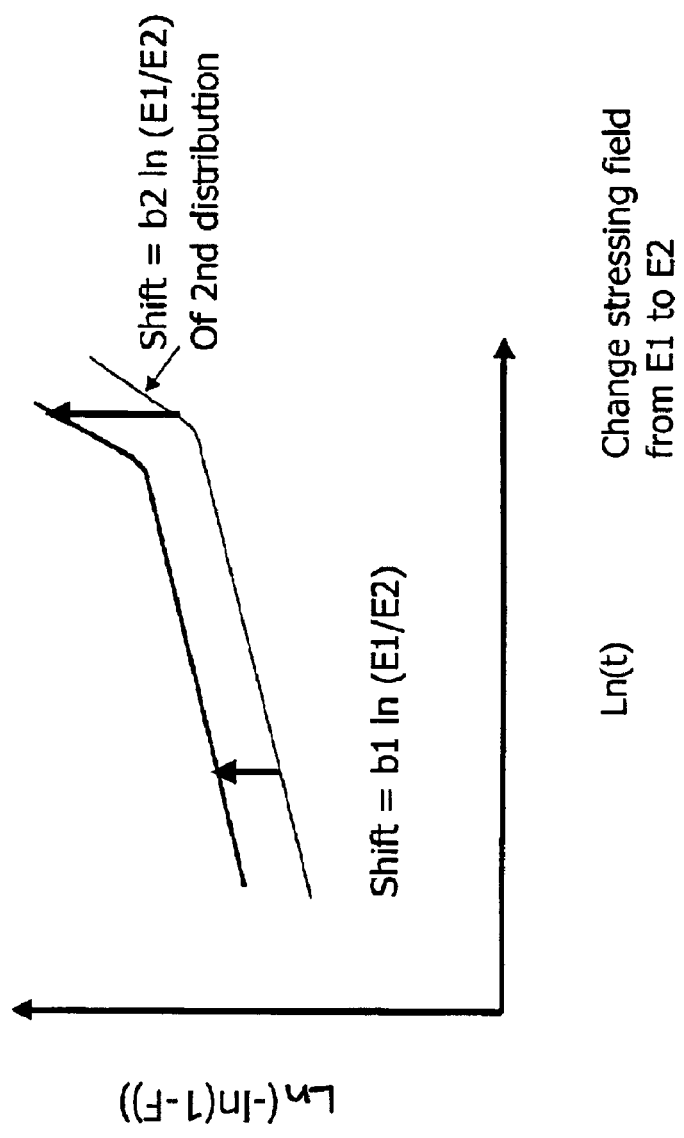
FIG. 5 is a schematic diagram illustrating the Weibull representation of dielectric breakdown failures, wherein stress levels are changed (changing field or current).

Once determined, these parameters give a complete description of the rates of failure in a system at arbitrary fields and times. It is, however, only valid for a single type of distributed defect. If there is more than one type of defect present, as is almost always the case, then the parameter set for this distribution is determined independently and then added to the other distribution. In addition to voids, there is a second, higher field class of defect activated by the electrical stress. Fortunately, this class may be clearly separated from the void part of the distribution and analyzed separately. The parameter set: C, a and b give a kind of "fingerprint" for particular distributions of defects. An example of a typical case is shown schematically in FIG. 4. Such plots are very useful. For instance, they allow for result scaling to arbitrary capacitor areas; C is proportional to A, and thus the scaling factor is simply $\ln(A_1/A_2)$. The "a" or time parameter for each mode of breakdown is read directly off the chart. In order to determine the "b" or field parameter, multiple measurements at different stress levels must be performed. This produces another simple scaling factor, b(lnE1/E2), which is analogous to the area factor. The difference between these area and field parameters is that the area scaling parameter is constant over all defect types (assuming random distribution), whereas the field parameter will in general be unique to each particular defect distribution or breakdown mode. Field scaling is illustrated schematically in FIG. 5 for a bi-modal case.

Figure 6:
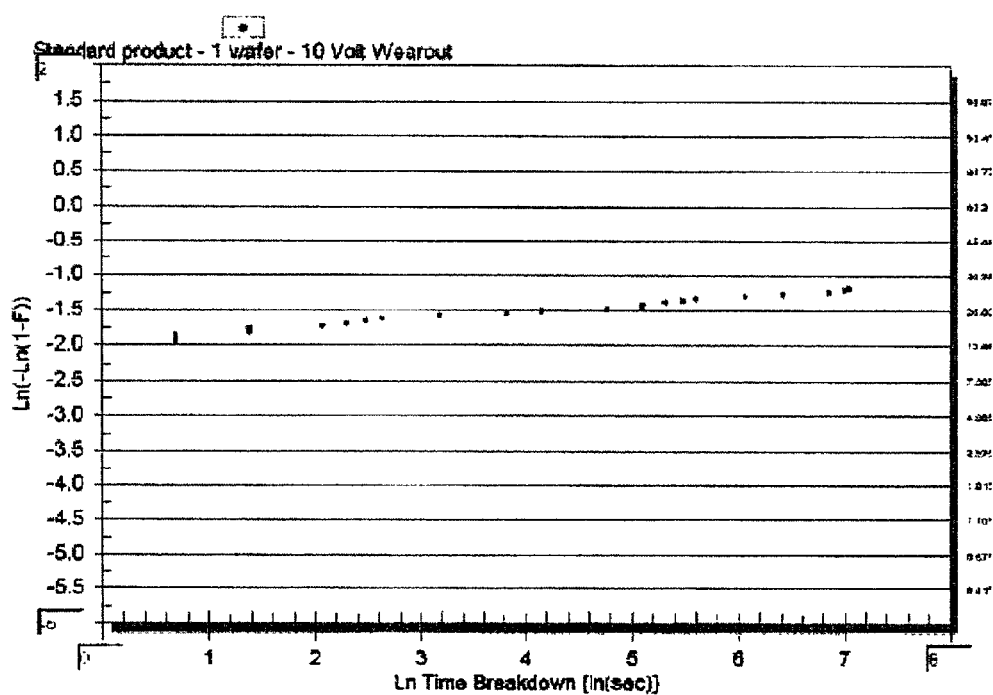
FIG. 6 is a graph illustrating constant field breakdown distributions for a typical void-related failure mechanism at 5 MV/cm. (Std. void distribution; 0.1 cm$^2$; 21 nm oxide; tested 166 dev.; 10 V stress; max. time allowed for breakdown: 2000 sec.; time parameter, a =0.15).

An example of a real and rather typical time dependent response for a void-dominated system is shown in FIG. 6. The time dependence for electrical damage accumulation by voids is relatively weak. The "a" parameter is found to be about 0.15. On average, it takes a relatively long time for a void which is not already broken down at the test field to transform itself into an electrical defect. Another consequence of this weak time dependence is that, in reliability terms, the failure rate decreases with time as devices fail by this mechanism. In this regard it is to be noted that it is only under these conditions that burn-in screening works.

FIG. 6, however, shows only a part of the breakdown picture. Another significant, but non-void related, breakdown mechanism is not seen, simply because the test did not last long enough. Based on other measurements, this mode exhibits a different time dependence in comparison to the void-related mechanism. The "a" parameter of the non-void related mechanism is greater than one (i.e., about 3), and thus this mode is quite different, both physically and statistically (i.e., the reliability perspective).

The problem with conventional test procedures described above is two-fold. First, they are extremely time consuming and, second, they offer a very narrow range of field investigation. Even at mid-range fields, such tests can require weeks. Since extrapolation down to low fields is the goal, this is not a particularly satisfactory method. A more convenient and highly complementary test is to extract the parameters necessary to predict reliability from a test which rapidly scans a wide range of fields. It is indeed possible to extract all of the parameters solely by means of ramped field tests.

Ramped Field Stress:

Ramped field testing of dielectric breakdown behavior is a popular method of testing. The hypothetical data of FIGS. 1 and 2 come from such a hypothetical test. The general belief about such tests is that they give information only about the field dependence of the breakdown distribution. In reality, however, they can yield very powerful information about the time dependence as well. Importantly, these tests can rapidly reveal the time dependence of individual modes of breakdown over a very wide range of fields.

In ramped field tests, both the field and time are varied simultaneously, unlike constant field tests. In order to disentangle the two parameters, one needs a model of how damage builds up or integrates as the field builds up over time. It has now been found that a simple additive damage build up model (see, e.g., R. Falster, *The Phenomenology of Dielectric Breakdown in Thin Silicon Dioxide Films*, J. Appl. Phys., 66, 3355 (1989)) does not describe the data from void-related breakdown for polysilicon cathodes, and that in order to explain the data of both ramped field and constant field stress a new model for damage (W) build up, as expressed in equation (7), is to be applied:

$$W = p[\int E(t)^d dt]^a \tag{7}$$

where $$d = b/a.$$

Upon integration of Equation (7) for a linearly ramped field, this equation produces the "Weibull" description of dielectric breakdown for ramped field tests, in terms of the same "a" and "b" parameters of the constant field test, as indicated in equation (8):

$$1-F = \exp\{-C[a/(a+b)]^a (dE/dt)^{-a} E^{a+b}\} \tag{8}$$

Taking the double logarithm to produce the Weibull ramped test plot yields equation (9):

$$ln(-ln(1-F))=(a+b)ln(E)-aln(dE/dt)+lnC+aln\{a/(a+b)\} \quad (9).$$

This is linear in ln(E). The slope of the line is equal to the sum of the parameters a+b.

Accordingly, it is to be noted that a change in ramp rate produces a simple shift in the Weibull plot in the amount of $aln[(dE_1/dt)/(dE_2/dt)]$. By simply performing variable ramped rate measurements on the same defect population, one obtains a set of parameters and conformation of these parameters over a wide range of fields. With this formulation, it is possible to go back and forth between data, constant stress and ramped stress tests, which is very useful.

Figure 7:
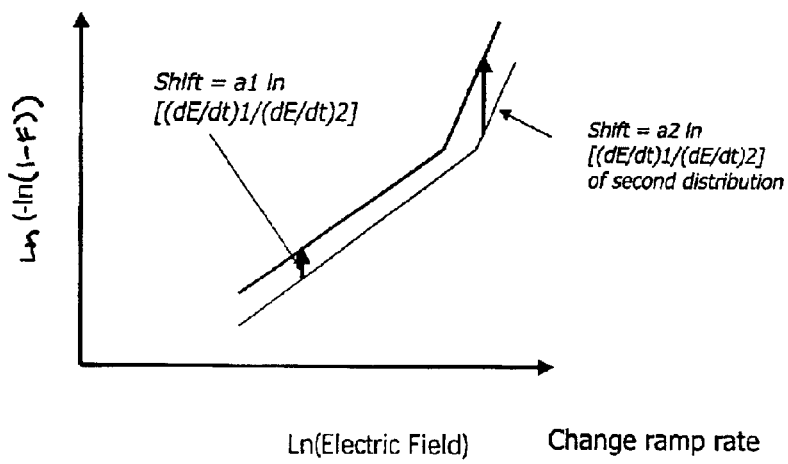
FIG. 7 is a schematic illustration of a Weibull analysis of ramped field data.
Figure 8:
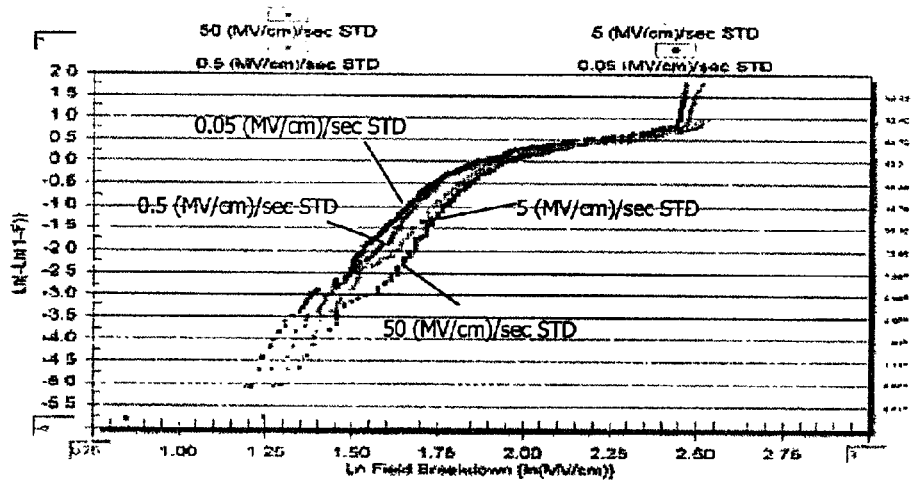
FIG. 8 is a graph illustrating variable ramp test results on void-containing silicon.

Referring now to FIGS. 7 and 8, FIG. 7 is a schematic illustration of this procedure, while FIG. 8 illustrates real data for void-containing systems. If the parameter is extracted from the ramp test results, using the methods above from the data of FIG. 8 (and other similar plots), the same results as simple constant field test (cf. FIG. 5) are obtained. The ramp test results, however, confirm that this value is valid over the entire range of fields in which voids dominate the breakdown distribution; in other words, the time dependence of void-related breakdown has the same form over the range of electric field under which it is active. Experimental evidence obtained to-date demonstrates that the "a" parameter, for void-related breakdown, is typically in the range of about 0.15 to about 0.18. With this information, it is possible to derive reliability performance from simple ramped test results using the statistical formalisms discussed above.

One aspect of the present invention, therefore, is a method of evaluating gate oxide integrity of a population of single crystal silicon wafers. This method comprises several steps: (i) determining the dielectric breakdown characteristics of a first subset of the population as a function of the amount of stress (e.g., an electric field), applied to the first subset wherein the amount of stress is increased at a first rate from an initial value to a final value, (ii) determining the dielectric breakdown characteristics of a second subset of said population as a function of the amount of stress applied to the second subset wherein the amount of stress is increased at a second rate from an initial value to a final value and the second rate is different from the first rate, and (iii) using the dielectric breakdown characteristics determined in steps (i) and (ii) to predict the gate oxide failure rate under a defined set of conditions for the population. Preferably, the first and second rates differ by a factor of at least 5, more preferably at least 10, and for some applications, by at least 100. In addition, in some embodiments it is preferred that three, four or even more subsets of wafers be evaluated at different ramp rates (which preferably differ from each other by a factor of at least 10). For example, in one embodiment each of four subsets of wafers of the population are subjected to an applied electric field which is linearly increased at a rate of 0.05, 0.5, 5 and 50 megavolts/cm/sec., respectively.

In one embodiment of the present invention, the population of wafers upon which the gate oxide integrity test is carried out may be wafers from a specific ingot (or portion thereof), a specific crystal growth process, or even a cassette or a plurality of cassettes of wafers. The subsets are selected from this population and thus may comprise a whole or fractional part of one or more wafers of the population. For example, each of the subsets may comprise a fractional part of the same wafer or wafers. Alternatively, each of the subsets may comprise a fractional part of different wafers. In yet a further alternative, the subsets comprise a fractional part of a partially overlapping set of wafers, i.e., each set comprises a fractional part of the same wafer or wafers and a whole or fractional part of different wafers.

Figure 9:
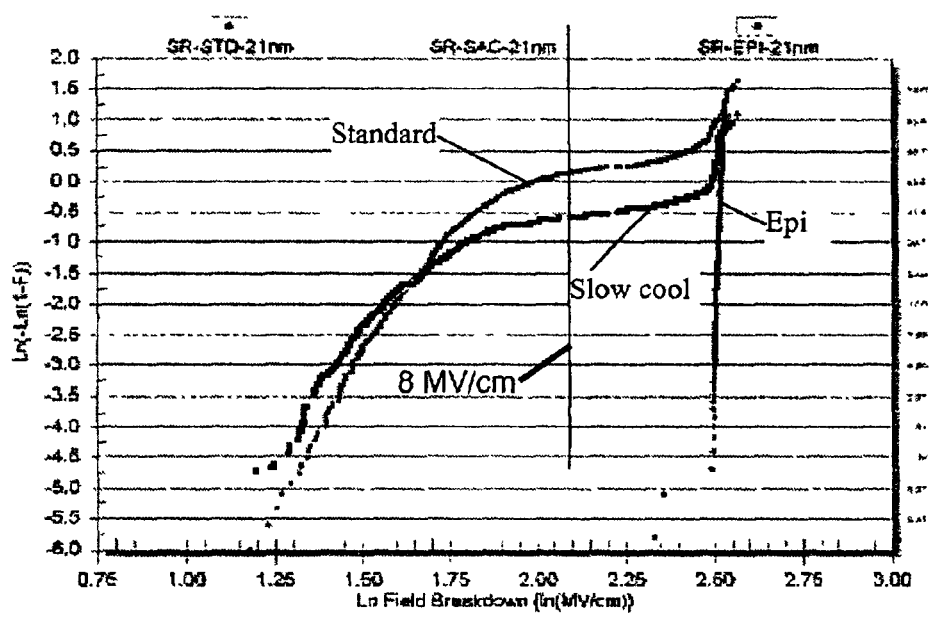
FIG. 9 is a graph illustrating Weibull plots comparing the ramped field breakdown distributions of typical "normal" (denoted "SR-STD") and "slow cooled" (denoted "SR-SAC") materials (defect-free, epi material, denoted "SR-EPI," provided as a reference).

Void-related Dielectric Breakdown Revisited:

Returning to the question of void-related breakdown distributions, a schematic view is illustrated in FIG. 2 of typical distributions in electric field of void-related breakdowns for "normal" and "slow cooled" types of crystal. Referring now to FIG. 9, actual data comparing the two types of material presented in the Weibull format is illustrated (results for void-free, epitaxial material is included as a reference, as is the "standard" BVOX reference field of 8 MV/cm). Viewed in this way, the usual differences between "slow cooled" and normal material (BVOX percentages) are self-evident. Furthermore, all three materials exhibit an identical behavior independent of the distribution of voids in the materials (again, noting that the very different high-field breakdown distribution is unrelated to voids).

With respect to FIG. 9, two features of these distributions should be particularly noted:

1. There is a "saturation" in the breakdown fails at a certain percentage for each distribution (related to the fact that there is a "peak" in the distribution, as described above). The simple reason for this result is that, by the time some characteristic field is reached, all of the voids in the system have been used up or "turned-on." This difference in the saturation failure percentages is a result of reducing the number density of voids by the "slow cooling" process. It should be noted that such a saturation effect does not exist for the other main mode of dielectric breakdown at high fields (here, the underlying physical defects are not countable). It is, of course, this saturation value that all BVOX tests, for example, actually measure. They thus directly measure the effective area density of the voids only.

Figure 10:
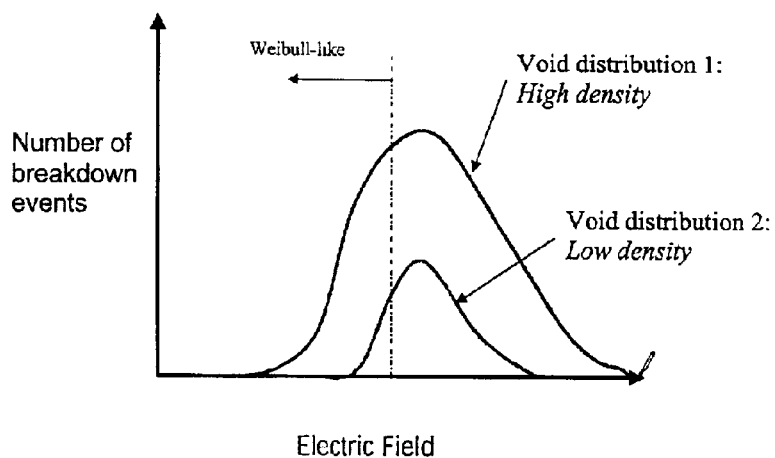
FIG. 10 is a schematic diagram illustrating the breakdown distributions in "normal" (or high density) and "slow cooled" (or low density) material if the differences between the two were simply a reduction in defect density.
Figure 11:
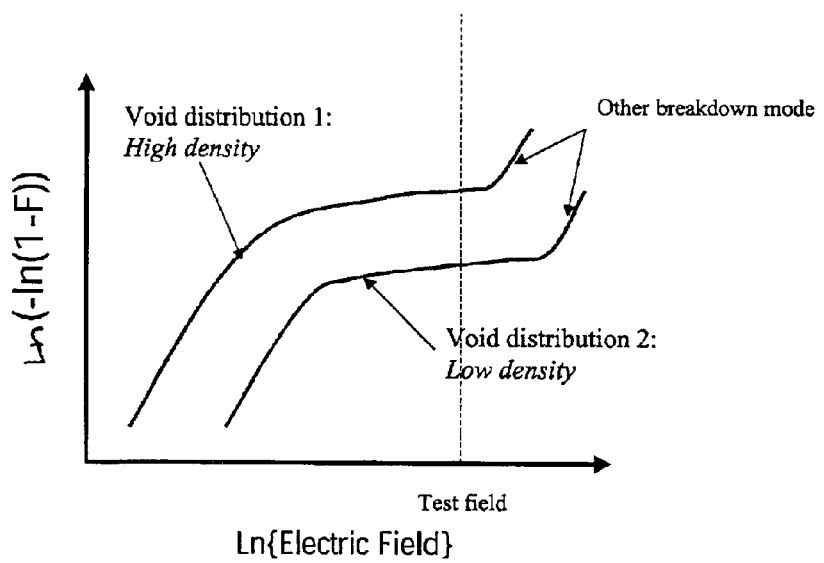
FIG. 11 is a schematic diagram illustrating breakdown distributions in "normal" (or high density) and "slow cooled" (or low density) material if the differences between the two were simply a reduction in defect density (plotted in Weibull form).

2. However, the result of the "slow cooling" process is not simply to reduce the number density of the voids, which can be shown by another schematic plot. Referring now to FIGS. 10 and 11, illustrated are what the fail distributions of the two cases would have to look like if the difference between the two were simply a result of density reduction. This is not observed. Instead, they take a form similar to that illustrated in FIG. 2. What this means is that, while the overall density of defects has been reduced by the "slow cooled" treatment, on average, "slow cooled" voids result in breakdowns at lower fields; that is, the distribution is shifted.

Figure 12:
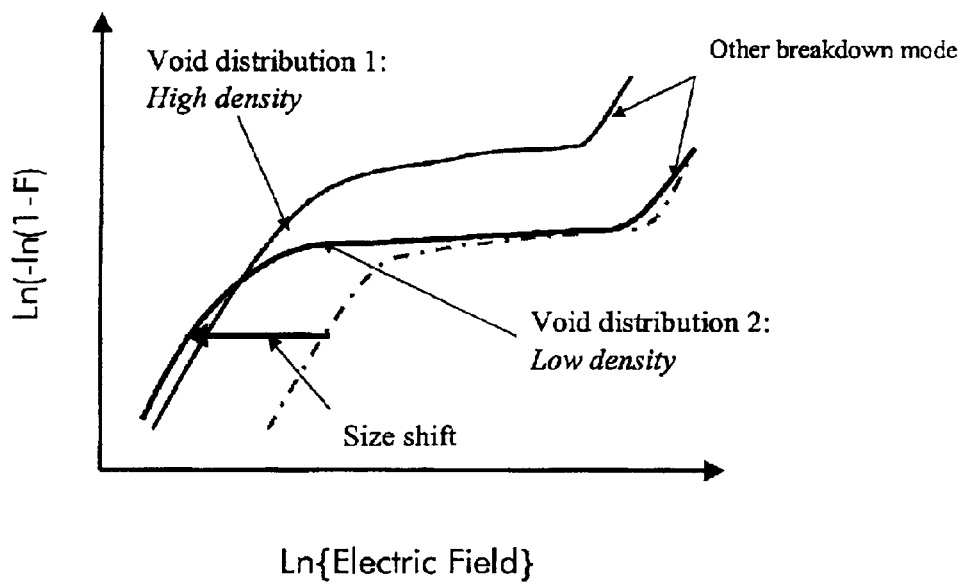
FIG. 12 is a schematic illustration of a Weibull analysis which shows in detail a shift which occurs as a result of void size; that is.

In general, voids produced by slow cool-type processes are larger. This is for the simple reason that in slow cool-type processes a smaller number of void sites consume the same number of vacancies as do the larger number of voids in "normal" processes. It is concluded then that the reason for this shift, illustrated in FIG. 12, is due to the increased average size of the voids in the slow cool distribution.

The Consequences of the Void Size Dependence of Dielectric Breakdown Distributions:

On the surface of things, the application of "burn-in" voltage rules leads one to the straight forward conclusion that the slow cool-type material, with its lower saturated fail percentages, is the better material. Of course, as pointed out herein, this result is not surprising because the very application of this test makes the outcome pre-determined. But, the real question is, what result would be obtained if a different criterion was applied? For example, assume one applies a test which is simply an application of real reliability criteria to the material system; that is, assume one applies a stress at the operating field, rather than some arbitrary field significantly higher than the operating field, and then sees which system has the most fails after, for example, 10 years.

Calculating Extrapolated Reliability:

In order to calculate extrapolated reliability, the system described above is used and extrapolate from ramped field data to constant field operation at a defined operating field. Manipulating equations (4) and (9) above, a simple expression can be written (equation 10) in Weibull form which allows the solution for the device wear-out to be determined at essentially any operating field:

$$F'(t,E_{op})=a\ln(t)+F''(E_{op},dE/dt)-a\ln[E_{op}/(dE/dt)]-a\ln[a/(a+b)] \quad (10)$$

where

1. $F'(t,E_{op})$, which is to be determined, is the Weibull number $\{=\ln(-\ln(1-F)\}$ of the time dependent failure distribution, at the (operating) field, $E_{op}$;
2. $F''(E_{op},dE/dt)$ is the Weibull number extrapolated to the (operating) field, $E_{op}$, from a ramp test result performed at the ramp rate dE/dt; this number is simply a linear extrapolation of the data and can be expressed as follows in equation (11):

$$F''(E_{op},dEdt)=F''(E_{sample},dE/dt)-(a+b)\ln(E_{sample}/E_{op}) \quad (11)$$

where $E_{sample}$ is some field value in the range where the slope a+b is valid, and $F''(E_{sample},dE/dt)$ is the Weibull number at this point;
3. a+b is the slope in lnE of the void-related part of the breakdown distribution from the ramp test results; and,
4. "a" is the time parameter deduced from variable ramp rate tests on the same distribution, or from sample constant field/current tests.

Figure 13:
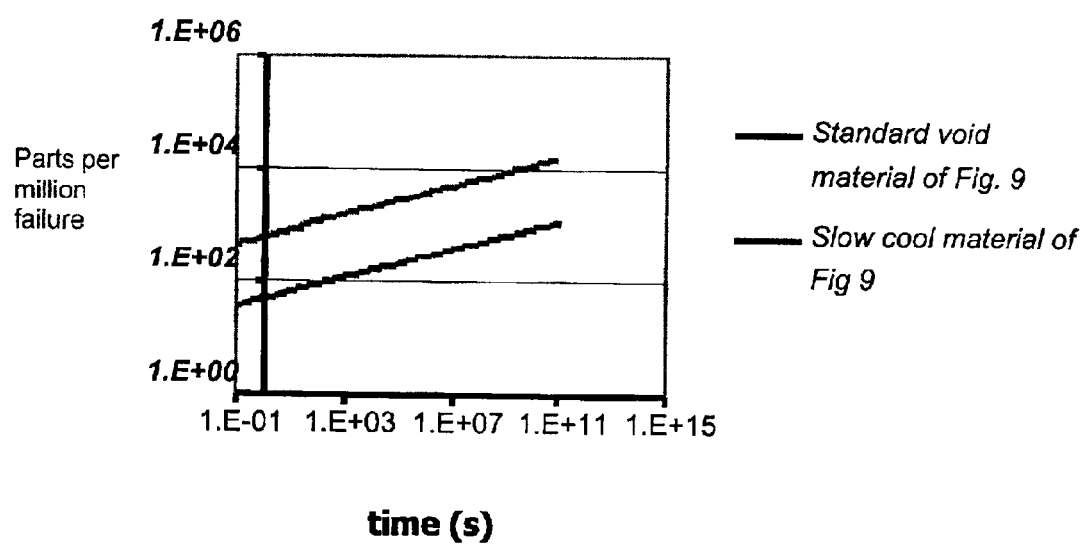
FIG. 13 illustrates the results of a calculated oxide reliability test in void-containing material; that is.

Comparison of Standard and "Slow Cool" Materials:

Referring again to FIG. 9, and in view of the foregoing, a comparison of the extrapolated reliability of the two material systems at an operating voltage of 5V over a period of several years can be performed; this is done by applying equation (10) to data taken from FIG. 9. FIG. 13 illustrates the surprising results, surprising in that the standard material with a higher overall density of voids and corresponding worse BVOX results is actually the better material.

In this regard it is to be noted that, while the results illustrated in FIG. 13 are surprising, they are in fact moot in this case because neither material would meet the reliability requirement of 1 ppm failure in ten years (where 10 years equals about $3.15 \times 10^8$ seconds) Clearly, the devices made from both materials have to be screened (i.e., burned-in) in order to meet these requirements. However, it is still to be noted here that the application of the burn-in test picks the wrong answer, and accordingly would have resulted in the waste of acceptable silicon in the process.

In view of the foregoing, it can be seen that conventional screening procedures incorrectly identify the slow-cooled material as superior by measuring in the saturation regime. Because the number of failures are so small, the difference in this regime never enters into the real reliability question, or rather it would not enter in until perhaps about 10,000 years or so of device operation. The real issue therefore lies in the initial part of the breakdown distribution; in particular, it lies in the intercept of the rising portion of the curve with the operating field (adjusted by a couple of constants from equation (9)).

"Functionally" Defect-free Silicon

According to the process of the present invention, it has been discovered that, once a method of analysis for gate oxide integrity has been properly defined and applied, it is clearly preferable to grow single crystal silicon under conditions which yield wafers having voids which are smaller in size and higher in concentration (or number density), in contrast to what has heretofore been deemed acceptable (based on conventional GOI methods of analysis). Stated another way, it has been discovered that, once gate oxide integrity is more accurately defined and measured, single crystal silicon wafers having a higher concentration of smaller voids is preferably to material having, in comparison, a lower concentration of larger voids (as further described herein). Experience to-date indicates that such wafers, from a functional standpoint, are in most cases of a quality comparable to substantially defect-free silicon.

Specifically, the present invention enables the engineering or preparation of "functionally defect-free" silicon, which is a material designed to meet two basic criteria:

1. The material meets the stated requirement for reliability, whatever that requirement may be for a given application (e.g., 1 ppm fail in 10 years of device operation); and (optionally),
2. The material has essentially no detectable fails at the burn-in voltage.

With respect to the second criterion, it is to be noted that this is not technically a requirement; that is, true "functional perfection" is met completely by the first criterion. However, the burn-in criterion (2) is nevertheless important, since the material will typically have to meet burn-in test requirements of integrated circuit manufacturer. Accordingly, even if this is not necessarily a rational test for gate oxide integrity, it is nonetheless a kind of function, if not an operating one. Furthermore, there may be other reasons, beyond the control of the silicon manufacturers, for users to perform this specific test at a particular value of burn-in voltage. As a result, this requirement should preferably be met also by the silicon material.

Void Size Distribution and "Functional Perfection:"

It was noted above, in the discussion of FIGS. 10 through 12, that the initial part of the Weibull curve is determined less by the density of the voids than by their size distribution. Accordingly, this is a key to "functional perfection." It is quite a different approach, as compared to all conventional attempt to improve material. More specifically, in all other proposed material improvement methods (e.g., slow cooling, defect-free silicon, epitaxial silicon), the idea has been to reduce the density of voids, whereas in the present invention the focus is on reducing the size of the voids (control of void density being optional here and, in at least some embodiments, a minimum void density actually being required).

Generally speaking, the size of voids is reduced by fast cooling ("fast" cooling being described in greater detail below). There are two components to this approach:

1. Through kinetic limitations, fast cooling reduces the efficiency of vacancy transport, and thus reduces the effects of vacancy "sinking" to voids. As a result, voids do not become as big.
2. Fast cooling produces a higher density of voids. As a result, given a fixed concentration of vacancies, there is a smaller number of available vacancies per void (this, of course, is where "slow cool" material does poorly in the present context).

With this in mind, consider that fastest cooling in conventional CZ silicon is usually found in the tail-end region, where the pulling rate typically increases sharply to make the tail-end. This also has the effect of changing the cooling rate of the crystal in regions cooler than the melt interface.

Here we are particularly interested in the cooling rate of the crystal in the void nucleation temperature region, which typically ranges from about 1000° C. to about 1200° C., and the void growth temperature region, which typically ranges from about 1110° C. to about 900° C. (both of which are described in greater detail below). The axial positions of these temperatures, relative to the melt-solid interface, are determined by the hot zone design or configuration.

Figure 14:
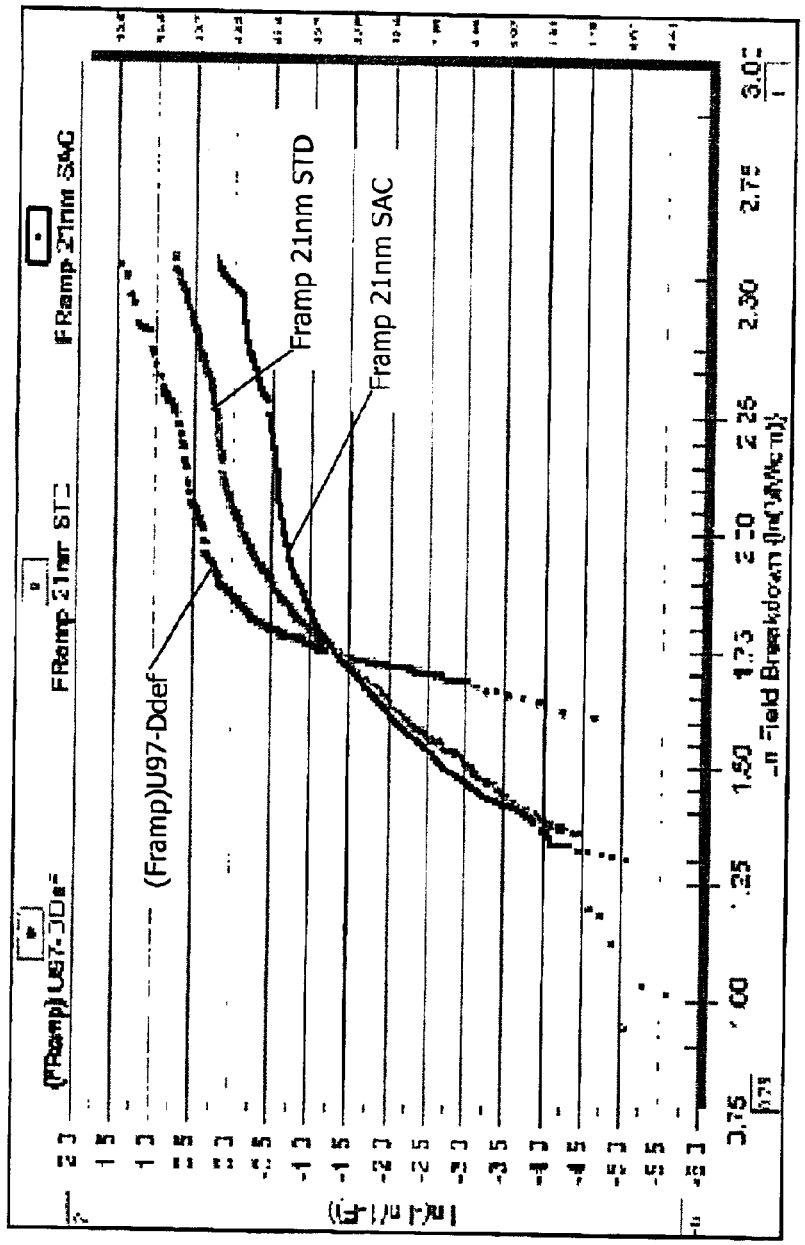
FIG. 14 is a graph illustrating the breakdown distributions of a given void-containing material (denoted "STD"), as well as, for comparison, a "slow cooled" (denoted "SAC") and "fast cooled" (denoted "U97-DDef"), obtained from a rapidly cooled tail-end section of an ingot).

Referring now to FIG. 14, a comparison is provided of the breakdown distribution of a given or standard material, relative to silicon materials obtained from comparably "slow cooled" and "fast cooled" (denoted "U97") processes. These results are rather striking, within the context of the present discussion. More specifically, it is to be noted:

1. The larger void density of the fast cooled material is clearly seen in the larger saturated fail percentage (less striking). A 8 MV/cm BVOX test result would yield about 85% fail for the fast cooled material, 65% fail for the standard material and 45% for the slow cooled material; in short, by standard test methods, the material of the present invention appears to be inferior.

Figure 15:
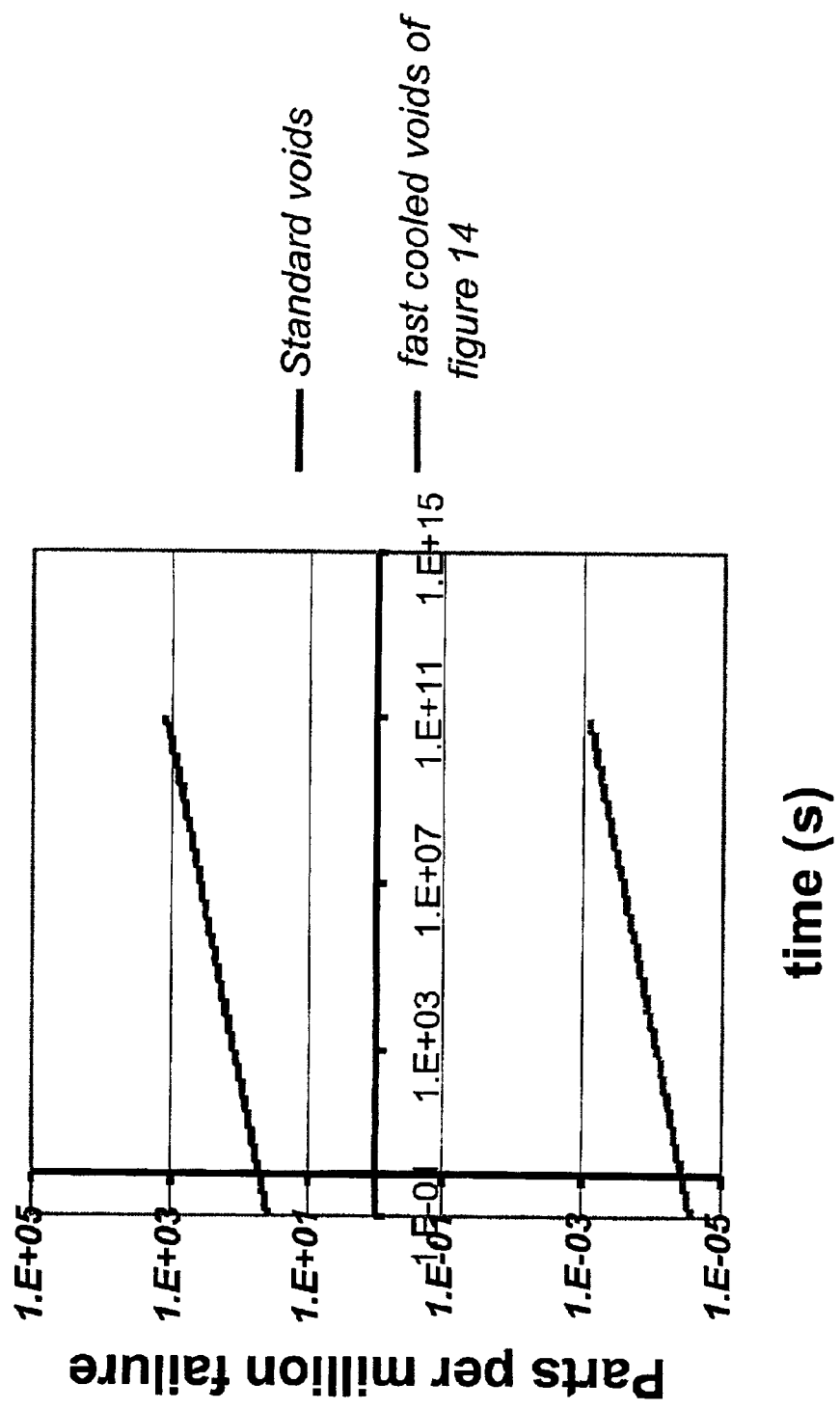
FIG. 15 is a graph which illustrates the reliability extrapolations for the standard material (upper curve) and "fast cooled" (lower curve) material of FIG. 14; that is.

2. The smaller void sizes of the fast cooled material results in a shift of the initial part of the distribution toward higher fields. Furthermore, the slope of this part of the distribution becomes steeper. A large slope is much more powerful than a mere parallel shift in the distribution because it will drive the intercept at the operating field to significantly lower values. The reason for this increase in the slope (and hence tightening of the distribution of failures in field) is understood to be due to a smaller range in void cross-sectional area available at the silicon-oxide interface. Accordingly, in spite of the notable failure of the BVOX test, the fast cooled material is exceptionally good when it comes to reliability performance. Referring now to FIG. 15, a comparison is provided of the predicted reliability of this material with that of the (better BVOX performing) standard material. It should be note that, from these results, it can been that in ten years of operation the fast cooled material produces better than about 0.001 ppm fails, which greatly exceeds even the most stringent of requirements. It is to also be noted that, at a burn-in field of, for example, 5 MV/cm (which is twice the operating voltage), there is essentially no measurable yield loss (i.e., much less than about 1% fail).

Crystal Growth Considerations for "Functionally Perfect" Material:

The framework for the models which describe the density and size of voids produced in silicon as a function of growth conditions have been described in several recent publications. (See, e.g., V. V. Voronkov et al., *J. Cryst. Growth*, 194, 76 (1998); V. V. Voronkov, J. Cryst. Growth, 204, 462 (1999); and, R. Falster et al., *On the Properties of the Intrinsic Point Defect in Silicon*, Phys. Stat. Sol., (B) 222, 219 (2000). See also PCT Application Nos. PCT/US98/ 07304, 07305 and 07365, all of which are incorporated herein by reference.) Generally speaking, however, the concentration of the vacancies which compose the voids is determined by the parameter $v/G_0$ at the melt/solid interface, wherein v is the growth velocity and $G_0$ is the average axial temperature gradient over a temperature range bound by the solidification temperature and a temperature greater than about 1300° C. (e.g., about 1325° C., 1350° C. or even 1375° C.). The larger this value, in excess of the critical value for $v/G_0$, the larger the vacancy concentration incorporated into the growing crystal. These vacancies become critically supersaturated at some "nucleation" temperature (which itself is dependent upon the concentration of vacancies, in that the higher the vacancy concentration, the higher this temperature), and thus voids are formed. The density of voids produced is essentially proportional to the factor:

$$\frac{q^{3/2}}{C_v^{1/2}}$$

where
q is the cooling rate at the nucleation temperature; and,
$C_v$ is the vacancy concentration at the point of nucleation.

The nucleation process for agglomerated intrinsic point defects typically occurs at a temperature greater than about 1000° C. (e.g., about 1050° C., 100° C., 1125° C., 1150° C., 1175° C., or even 1200° C.). However, it is to be noted that the temperature at which nucleation of the predominant intrinsic point defects occurs can be experimentally determined for a given crystal puller and process as follows. It is believed that silicon self-interstitials in a defined region of the ingot remain as point defects and do not nucleate to form agglomerated defects until that region passes through the section of the hot zone where the silicon reaches the temperature of nucleation. That is, under typical Czochralski growth conditions, the region is originally formed at the solid/liquid interface and has a temperature of approximately the melt temperature of silicon. As the region is pulled away from the melt during the growth of the remainder of the ingot, the temperature of the region cools as it is pulled through the hot zone of the crystal puller. The hot zone of a particular crystal puller typically has a characteristic temperature profile, generally decreasing with increasing distances from the melt solid interface, such that at any given point in time, the region will be at a temperature approximately equal to the temperature of the section of the hot zone occupied by the region. Accordingly, the rate at which the region is pulled through the hot zone affects the rate at which the region cools. Accordingly, an abrupt change in the pull rate will cause an abrupt change in the cooling rate throughout the ingot. Significantly, the rate at which a particular region of the ingot passes through the temperature of nucleation affects both the size and density of agglomerated defects formed in the region. Thus, the region of the ingot which is passing through the nucleation temperature at the time the abrupt change is made will exhibit an abrupt variation in the size and density of agglomerated intrinsic point defects, hereinafter referred to as a nucleation front. Because the nucleation front is formed at the time the pull rate is varied, the precise location of the nucleation front along the axis of the ingot can be compared to the position of the ingot, and correspondingly the nucleation front within the hot zone at the time the abrupt change in pull rate was made, and compared with the temperature profile of the hot zone, to determine the temperature at which the nucleation of agglomerated intrinsic point defects occurs for the type and concentration of intrinsic point defects in the location of the nucleation front.

Thus, persons skilled in the art can grow a silicon ingot by the Czochralski method under process conditions designed to produce an ingot which is either vacancy rich or silicon self-interstitial rich by making abrupt changes in the pull rate and, then by (i) noting the position of the ingot with respect to the temperature profile in the hot zone at the point in time in which the pull rate is changed, and (ii) observing the axial location of the nucleation front, an approximation can be made as to the temperature of nucleation for the concentration of intrinsic point defects present along the nucleation front. Additionally, since the temperature and intrinsic point defect concentration varies radially along the nucleation front, the temperature and intrinsic point defect concentration can be determined at several points along the nucleation front and the temperature of nucleation can be plotted against the intrinsic point defect concentration to determine the temperature of nucleation as a function of intrinsic point defect concentration. The temperature of the silicon along the nucleation front can be determined using any thermal simulation method known in the art which is capable of estimating the temperature at any location within a Czochralski reactor, such as for example, the thermal simulation described in Virzi, "Computer Modeling of Heat Transfer in Czochralski Silicon Crystal Growth," *Journal of Crystal Growth*, vol.112, p. 699 (1991). The concentration of silicon self-interstitials may be estimated along the nucleation front using any point defect simulation method known in the art which is capable of estimating the concentration of intrinsic point defects at any point in the ingot, such as for example, the point defect simulation described in Sinno et al., "Point Defect Dynamics and the Oxidation-induced Stacking-Fault Ring in Czochralski-Grown Silicon Crystals, "*Journal of Electrochemical Society*. vol.145, p. 302 (1998). Finally, the temperature of nucleation verses intrinsic point defect concentration can be obtained for an expanded range of temperatures and concentration by growing additional ingots under varying growth parameters to produced ingots with increased or decreased initial concentrations of intrinsic point defects, and repeating the cooling experiment and analysis described above.

The nucleation process quickly stops once the temperature is within a few Kelvin (e.g., about 2, 4, 6, 8 or more) of the nucleation temperature. Once this temperature is reached, no new voids are produced, but existing voids can continue to grow in size until the diffusion of vacancies becomes so slow as to stop the growth process; that is, once void nucleation stops, void growth will continue as long as vacancies are capable of diffusing to void sites within a commercially practical period of time. In oxygen containing Czochralski silicon, vacancies are bound to oxygen at a characteristic temperature of about 1000° C. (e.g., about 1010° C., 1015° C., 1025° C., or even 1050° C.). In the bound state, the vacancies are effectively immobile on the time scale of void growth. By the time a temperature of about 900° C. (e.g., about 910° C., 925° C., 950° C. or even 975° C.) is reached, essentially all void growth stops.

In view of the foregoing, the process of the present invention is focused upon the cooling rate of the crystal over two, and optionally three, distinct temperature ranges (optional because, in reference to FIGS. 18–20, if the cooling rate changes, the "window" of acceptable operating conditions gets bigger):

1. The first temperature range is near the melt-solid interface, where $v/G_0$ is established over a temperature range of about 1300° C. to about 1400° C. (i.e., over a temperature ranging from the solidification temperature to about 1300° C., 1325° C., 1350° C., or even about 1375° C.). The cooling rate within this range influences whether vacancies are the predominant intrinsic point defect from about the central axis of the ingot to about the lateral surface of the ingot for the particular segment of interest.
2. The second range of temperatures is that over which void nucleation occurs. Void nucleation generally occurs at temperatures ranging from about 1000° C. to about 1200° C., from about 1025° C. to about 1175° C., from about 1050° C. to about 1150° C., or from about 1075° C. to about 1125° C. Controlling the rate of cooling over this temperature range influences void density.
3. The third range of temperatures is that over which void growth occurs; that is, the temperature range over which silicon lattice vacancies are still mobile, for commercially practical periods of time, after nucleation has occurred. Void growth, or vacancy diffusion, typically occurs over a temperature range of about 900° C. to about 1100° C., from about 925° C. to about 1075° C., or from about 950° C. to about 1050° C.

Exemplary details for how such growth conditions may be achieved are further described herein below.

In addition to controlling void nucleation and growth, it may also be important, in certain circumstances, to control the cooling rate through the temperature range over which vacancies are mobile, either alone or in combination with the control of $v/G_0$ (which determines the initial vacancy concentration), in order to limit the residual vacancy concentration in the silicon segment. More specifically, it is currently believed that when silicon having concentrations of vacancies in excess of about $3 \times 10^{12}$ cm$^{-3}$ (as determined by, for example, the platinum diffusion method described herein below) is exposed to temperatures commonly employed in integrated circuit manufacturing processes (e.g., temperatures ranging of about 600° C. to 800° C.), a form of catalyzed oxygen precipitation will occur. This oxygen precipitation can be beneficial or detrimental, depending upon the degree of precipitation that occurs. For example, such precipitation is beneficial when it can be controlled by thermal treatments such as those described in U.S. Pat. No. 5,994,761 (incorporated herein by reference), in order to form wafers which have controlled vacancy profiles (which in turn lead to a controlled oxygen precipitation profile). In contrast, this precipitation is detrimental when it cannot be controlled, because it can cause oxygen precipitation in crystals to run out of control (in the sense that a subsequent thermal treatment, such as those disclosed in for example U.S. Pat. No. 5,994,761 and PCT Application No. PCT/US99/19301 (incorporated herein by reference), cannot erase or dissolve the oxygen clusters which form as the crystal cools). A common example of a situation wherein precipitation typically runs out of control can be found in the extreme tail-end of crystals wherein very rapid cooling occurs.

Figure 16:
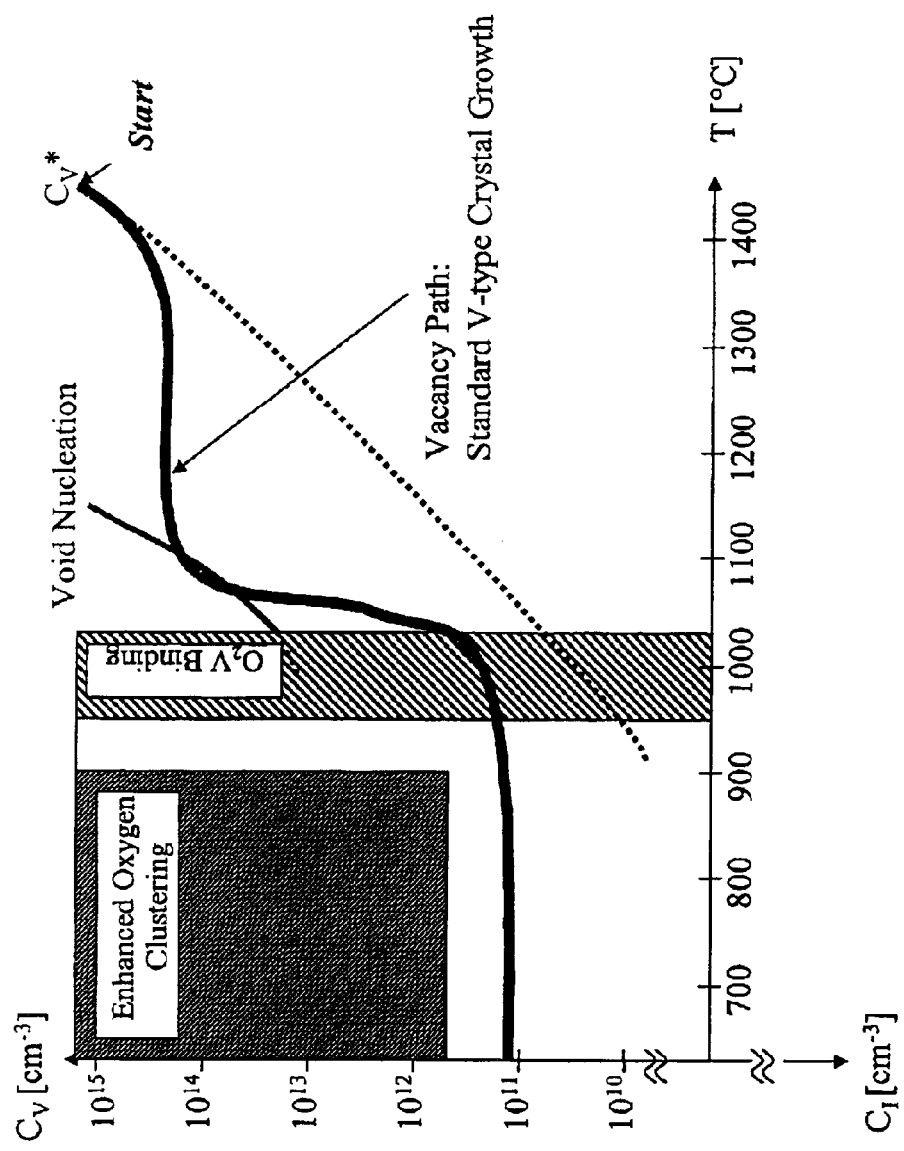
FIG. 16 is a graph which illustrates the production of voids in a growing crystal under the most typical cooling rates (showing that, under such conditions, the consumption of vacancies to voids is efficient enough to reduce their concentration to a value below the precipitation enhancement threshold by the time vacancies become bound to oxygen).
Figure 17:
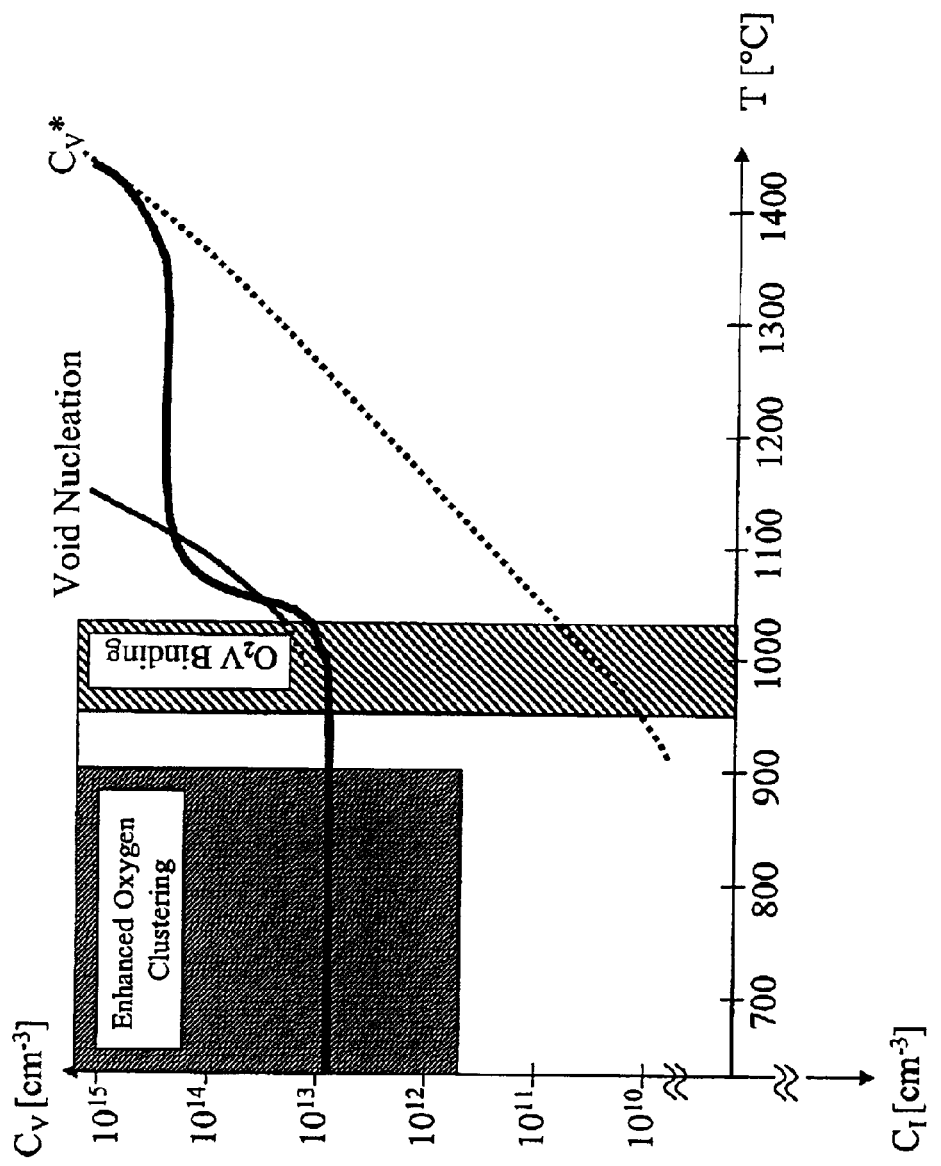
FIG. 17 is a graph which illustrates the production of voids in a growing crystal which, in comparison to the crystal in FIG. 16, is cooled more rapidly (showing that, by cooling more rapidly through the void growth regime, anomalously high values of oxygen precipitation result, due to the high levels of residual vacancies at the time the crystal enters the binding regime).

In normal crystal growth regimes, voids are such effective consumers of vacancies that practically none, certainly far fewer than the $3 \times 10^{12}$ cm$^{-3}$ threshold for the enhanced precipitation effect, remain as the crystal enters the vacancy binding regime. If, however, the crystal is cooled rapidly, such as described herein, then there is some risk that insufficient vacancies are consumed during the growth phase. Schematically, this situation is illustrated in FIGS. 16 and 17. More specifically, FIG. 16 illustrates the production of voids in a growing crystal in the most typical case. Under such conditions, the consumption of vacancies to voids is efficient enough to reduce the vacancy concentration to a value below the enhanced precipitation threshold by the time vacancies become bound to oxygen. In contrast, FIG. 17 illustrates the production of voids in a growing crystal which is more rapidly cooled through the void growth regime. The more rapid cooling results in "anomalously" high values of oxygen precipitation, due to the high levels of residual vacancies at the time the crystal enters the binding regime.

In order to produce "functionally perfect" (i.e., "functionally defect-free") silicon, voids must be sufficiently small in size, such that the requirements described above with respect to reliability are met. This necessitates relatively high cooling rates. On the other hand, for a useful product, oxygen precipitation must also be controllable; that is, one should be capable of producing denuded zone-type (see, e.g., U.S. Pat. No. 5,994,761) or non-oxygen precipitating-type (see, e.g., PCT Application No. PCT/US99/19301) behavior in the silicon. These two requirements are not necessarily met simultaneously. Accordingly, one aspect of the present invention is the simultaneous meeting of these two requirements and the description of the conditions under which this can be achieved.

Additionally, it is to be noted that, in some instances, there is a possibility that the voids themselves will hinder or prevent the formation of an acceptable denuded zone if sufficiently numerous. In some circumstances, therefore, it may be preferred that the density of voids be less than about $1 \times 10^8$ cm$^{-3}$.

In those situations where all of the above described limitations are met, a silicon material referred to herein as "useful, functionally perfect" silicon is formed.

Figure 18:
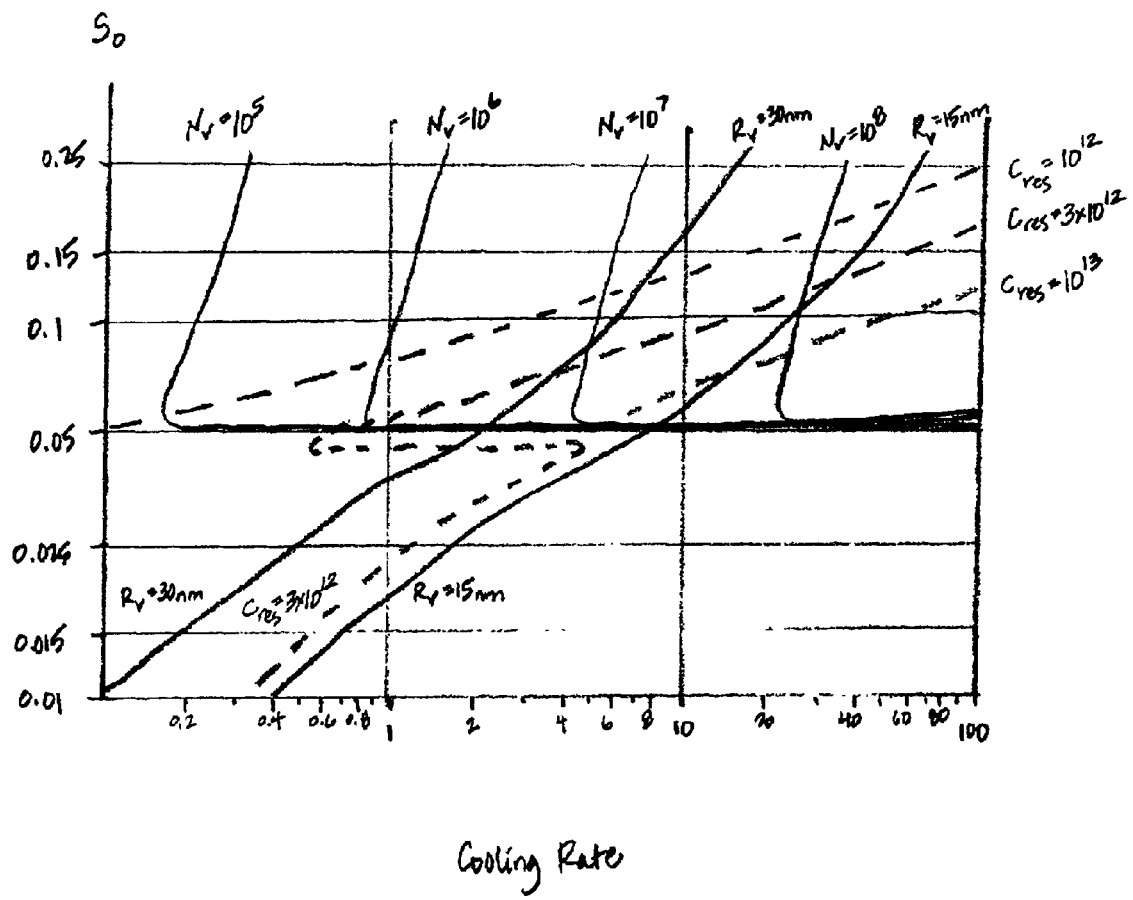
FIGS. 18, 19 and 20 are graphs which illustrate a series of models for predicting the behavior of the silicon material under given conditions. Generally, these graphs illustrate that for different conditions (e.g., growth conditions, cooling rate, etc.), a certain size of voids and a certain residual vacancy concentration are obtained. Accordingly, it is to be noted that while these graphs illustrate general regions for growth conditions which may yield a given material, further experimentation can be carried out to refine the conditions within or about these regions. As shown: the X axis (log scale, ranging from about 0 to 100) is the cooling rate (K/min.); the Y axis (ranging from about 0.01 to 0.25) is $S_0$ (the vacancy concentration when the silicon is formed, based on the ratio $v/G_0$); the generally diagonal, dashed/dotted lines indicate the residual vacancy concentration ($C_{res}$); the generally diagonal, solid lines indicates void radius ($R_v$); and, $N_v$ indicates the void density (the generally "L" shaped lines for each $N_v$ value being isocontours for void density, each contour having essentially the same lower limit, below which "defect free" material would be formed). Also, because of the need to make certain assumptions concerning the value of certain of the parameters involved in the calculations required to generate these curves, it should be understood that these curves are intended to demonstrate the existence of a set of operating conditions, or space, in which "useful, functionally perfect" silicon of the present invention may be manufactured; thus, the boundaries of this space may not precisely define the boundaries of the operating conditions in which "useful, functionally perfect" silicon of the present invention may be manufactured in all crystal pullers. More specifically.

Calculations of the Crystal Growth Conditions for "Useful, Functionally Perfect" Silicon:

The calculations which are used to define the operating conditions for such material are relatively complex and multi-dimensional, involving the coupling of several crystal growth parameters. Using the model elements (herein the "standard" model) developed in the references cited above, these can be estimated and then further refined, for example, empirically or by additionally modeling (using means described herein or which are standard in the art). The results are summarized in the complex chart sketched in FIG. 18. More specifically, FIG. 18 is an exemplary illustration of a calculation of the void size/void density/residual vacancy space as a function of incorporated vacancy concentration (wherein $S_0$ is the vacancy concentration, $Cv$, normalized to the melting point concentration, $Cv_m$) and constant cooling rate (e.g., constant cooling from about 1400° C. to some temperature at which, for a given vacancy concentration, vacancies are no longer mobile within a commercially practical period of time). These calculations provide the values of the parameters important to the formation of "useful, functionally perfect" silicon. These parameters are:

| 1. | Void density: | $N_v$ (cm$^{-3}$) |
|---|---|---|
| 2. | Void Size: | $R_v$ (average radial distance, in nm, from about the center of the void to the outer edge) |
| 3. | Residual vacancy concentration: | $C_{res}$ (cm$^{-3}$) |

In general, the space of these parameters is given as a function of two crystal growth parameters:

1. The incorporated vacancy concentration (identified as $S_0$ in FIG. 18). $S_0$ is the concentration of vacancies incorporated in the crystal normalized to the melting point solubility of vacancies. This number is related to the $v/G_0$ conditions under which the crystal was grown. A simple analytical expression linking the two has been previously discussed, for example, by V. V. Voronkov et al., *J. Appl. Phys.*, 86, 5975 (1999), which is incorporated herein by reference. Generally speaking, this relationship may be expressed as follows:

$$S_0 = Cv_0/Cv_m \sim 0.23 \times (v/v_c - 1)/(v/v_c + 0.15)$$

where $Cv_0$ is the "installed" vacancy concentration; that is, the vacancy concentration as determined by $v/G_0$;

$Cv_m$ is the vacancy concentration at the melting point; that is, the vacancy concentration based on the melting point solubility of vacancies;

$v$ is the growth velocity; and $v_c$ is the critical growth velocity; that is, $v_c = GE_{cr}$, where $E_{cr}$ is $(v/G)_{critical}$.

2. The cooling rate of the crystal—In these calculations, the cooling rate is assumed to be constant through both the void nucleation and the void growth regimes (as described above).

The intersection of these parameter spaces in the chart represents a map of the conditions under which a desired result may be achieved. While the precise values for the crystal growth parameters necessary to meet the requirements for the formation of "useful, functionally perfect" silicon may vary in some instances, experimental evidence to-date suggest the approximate values are:

| 1. | $N_v$: | less than about $1 \times 10^8$ cm$^{-3}$ (in some embodiments, preferably less than about $5 \times 10^7$ cm$^{-3}$, $1 \times 10^7$ cm$^{-3}$, or even about $5 \times 10^6$ cm$^{-3}$); |
|---|---|---|
| 2. | $R_v$: | less than about 70 nm (in some embodiments, preferably less than about 60, 50, 40, or even 30 nm); |
| 3. | $C_{res}$: | less than about $3 \times 10^{12}$ cm$^{-3}$ (in some embodiments, preferably less than about $2 \times 10^{12}$ cm$^{-3}$, $1 \times 10^{12}$ cm$^{-3}$, $5 \times 10^{11}$ cm$^{-3}$, $1 \times 10^{11}$ cm$^{-3}$, $5 \times 10^{10}$ cm$^{-3}$, or even less than about $1 \times 10^{10}$ cm$^{-3}$). |

Using these values as an exemplary guide, the chart of FIG. 18 can then be used to map out the crystal growth conditions under which these values can be met, for a given crystal puller and crystal pulling process (as further described herein).

It is to be noted, with respect to these values, that in some instances, in order to achieve the desired residual vacancy concentrations and void size, some minimum void density may be necessary. Stated another way, depending upon the initial vacancy concentration and the cooling rate, among other things, there may be a minimum density of voids which is necessary in order for the residual vacancy concentration to be below the desired level (the voids acting as "sinks," to which the vacancies can diffuse and be consumed), and for the void size to be below the desired level (too few voids and too many vacancies resulting in voids which are too large). In such instances, typically the void density will be at least about $5 \times 10^6$ cm$^{-3}$, $1 \times 10^7$ cm$^{-3}$, $5 \times 10^7$ cm$^{-3}$, $1 \times 10^8$ cm$^{-3}$, or more.

"Standard Model"

Figure 19:
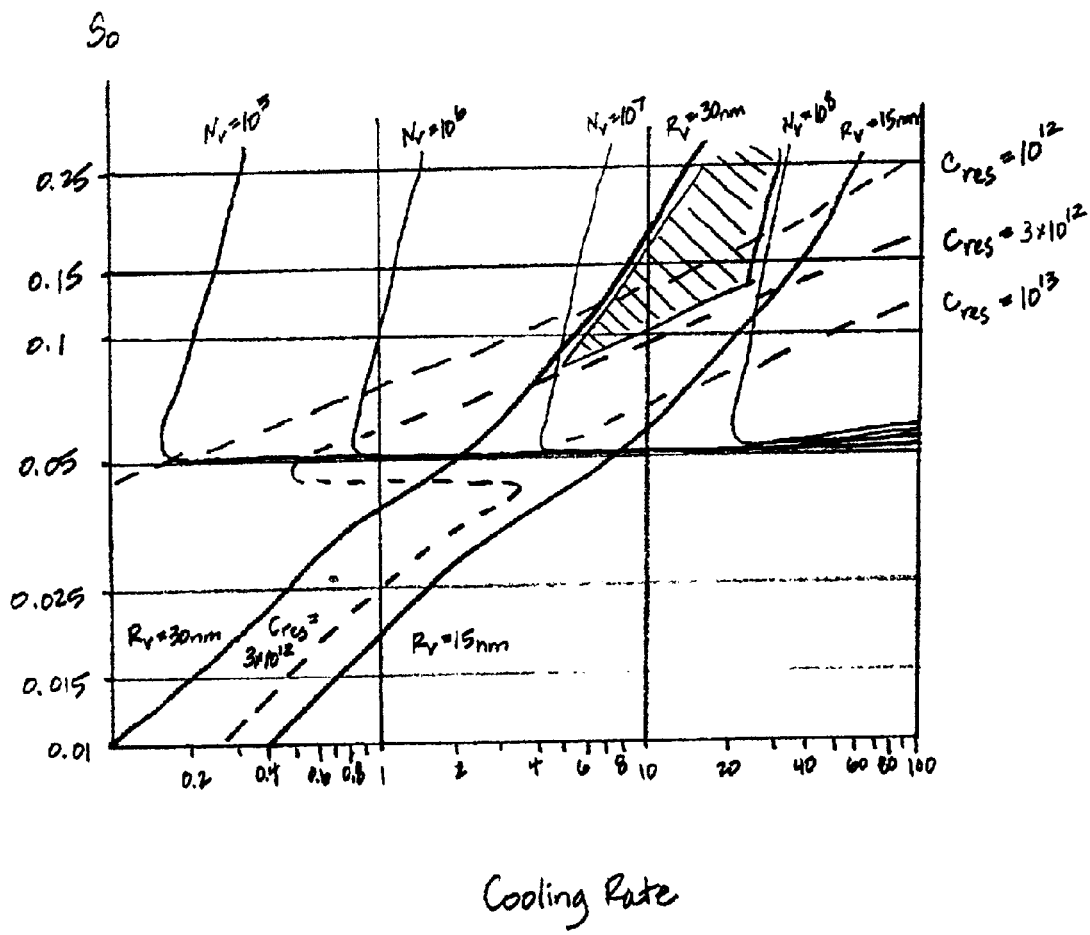

Referring now to FIG. 19, there is illustrated an exemplary operating window for meeting the above-described values using a "standard" model and assuming that the cooling rate is constant (from solidification to a temperature at which vacancies are no longer mobile within a commercially practical period of time). The values contained in the cross-hatched area are achieved at relatively high cooling rates and large values of $v/G_0$; that is, these values are achieved at fast pull rates and in hot zones designed to produce large axial temperature gradients. It is to be noted here that, if these temperature gradients are adjusted appropriately, there is essentially no upper limit to the pull rates in which these conditions can be met. Accordingly, it is for this reason that "useful, functionally perfect" silicon can be produced under essentially the fastest pull rates possible for a given crystal puller, and thus under the most cost-effective conditions known to-date.

Additionally, it is to be noted that there is a further degree of freedom in the growth of "useful, functionally perfect" silicon that is not illustrated in the already complex diagram of FIG. 19. More specifically, if the criterion of constant cooling rate through both the void nucleation temperature range and the void growth temperature range is relaxed, the hatched region can be increased in size. For example, if the cooling rates of the x-axis of the chart are interpreted to mean the cooling rate through the void nucleation range (e.g., from about 1080° C. to about 1150° C.) only, and then allow the cooling rate through the growth regime (e.g., from about 950° C. to about 1050° C.) to be less than this value, then the lower boundary of this area (i.e., constant $C_{res}$) will drop vertically on the chart. Based upon experimental evidence to-date, it is estimated that a change in the cooling rate of the second regime of only about 10% lower than that of the first range will remove this lower limit effectively entirely, without changing the other limits appreciably. Without being held to a particular theory, it is generally believed that the residual vacancies are being allowed sufficient extra time to be completely consumed by the voids of a density determined by the first regime cooling rate. Under the required conditions of a large $v/G_0$, the concentration of the residual vacancies is small compared to the initially incorporated vacancy concentration. Hence, the size of the voids is not changed in a meaningful or significant way.

"Modified Model"

Figure 20:
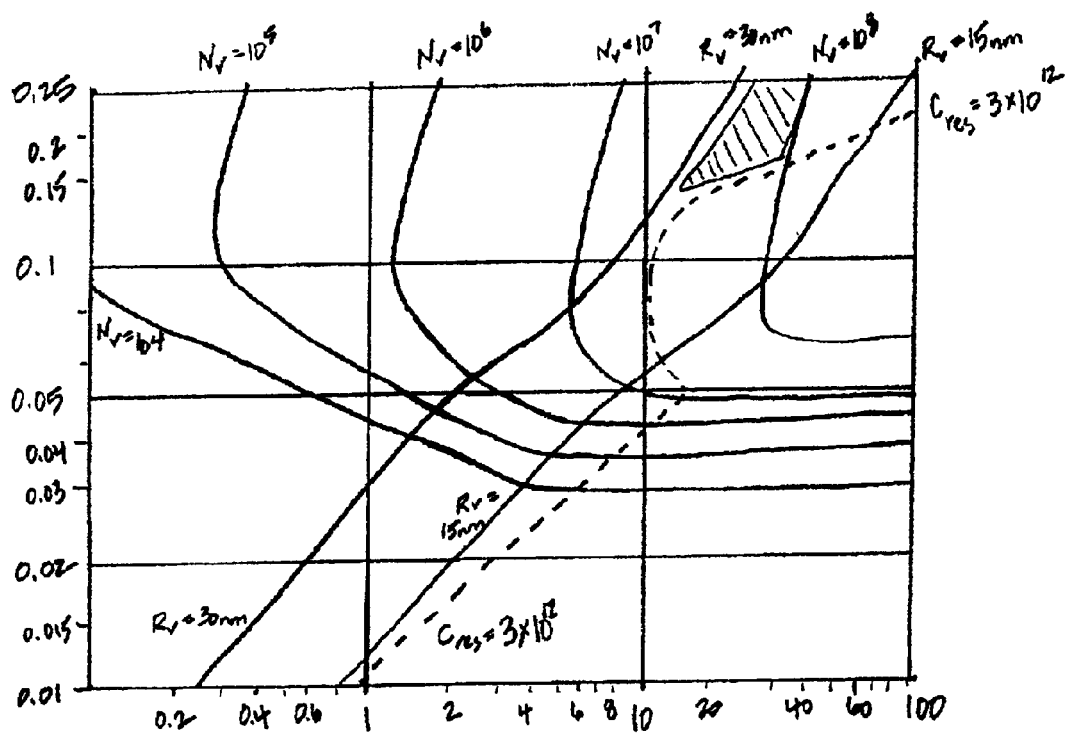

Referring now to FIG. 20, a second exemplary model for the void/vacancy consumption phenomena is considered. More specifically, FIG. 20 illustrates the results produced under a modified model, wherein only a slight but significant change has been made in the first, or standard, model. Here, "useful, functionally perfect silicon" can only be produced under conditions of a two stage cooling rate (as opposed to the constant cooling rate of the standard model). The operating conditions are highlighted.

In this example, the process space for the operating conditions to produce "useful, functionally perfect" silicon under the modified model are generally too small and at values of $S_0$ which are, in most cases, impractical. In order to produce silicon under such a model, therefore, we then require two stage cooling to eliminate the lower $C_{res}$ limit.

Control of $v/G_0$ and Cooling Rates

The general details for controlling $v/G_0$, in order to obtain vacancy-dominated silicon over an appreciable length of the constant diameter portion of a single crystal silicon ingot, are generally known by those of ordinary skill in the art and are described, for example, in PCT Application Nos. PCT/US98/07304, 07305, and 07365. Typically, however, in accordance with the present invention the growth velocity, v, and the average axial temperature gradient, $G_0$, will be controlled such that, for at least a segment of the constant diameter portion of the ingot (e.g., 10%, 20%, 40%, 60%, 80%, 90%, 95% or more, as measured along the central axis of the ingot), vacancies will be the predominant intrinsic point defect in an axially symmetric region having a width, as measured from about the central axis of the ingot toward the circumferential edge, or lateral surface, of the ingot, of at least about 25%, 50%, 75%, 85%, 95% or more, relative to the length of the radius of the ingot. In some embodiments, however, this region will preferably extend from the central axis to the lateral surface of the ingot; that is, preferably the width of the region will be essentially equal to the width of the constant diameter portion of the ingot. However, in those instances wherein this region does not extend from the central axis to the lateral surface, it may optionally be surrounded by another axially symmetric region, wherein silicon self-interstitials are the predominant intrinsic point defect and which is substantially free of agglomerated intrinsic point defects, as described in, for example, PCT/US98/07365.

It is to be noted in this regard that, prior to a thermal treatment, a single crystal silicon wafer, obtained from a single crystal silicon ingot grown in accordance with the present invention, will having a substantially uniform oxygen concentration, void concentration and vacancy concentration (excluding the near-surface region of the wafer). Stated another way, the axially symmetric, vacancy-dominated region of the present invention will extend substantially from the front surface of the wafer to the back surface of the wafer (i.e., the vacancy-dominated region will have a thickness of at least about 90%, 92%, 94%, 96%, 98%, or even about 100%, relative to the overall thickness of the wafer), the oxygen, void and residual vacancy concentration being substantially uniform throughout this region (i.e., from about top to bottom).

Given that the process of the present invention enables essentially the fastest possible growth rates for a given crystal puller to be employed, essentially any value in excess of the critical value of v/G may be employed. Referring again, for example, to FIGS. 18–20, it is to be noted in this regard that $S_0$ generally represents upward deviations from the critical value of $v/G_0$. In addition, FIGS. 18–20 provide exemplary data on the cooling rates; that is, for a given value of v/G (i.e., $S_0$), these graphs can be used to determine an approximate cooling rate needed in order to achieve the material of the present invention.

Control of the average axial temperature gradient, $G_0$, may be achieved through the design of the "hot zone" of the crystal puller, i.e. the graphite (or other materials) that makes up the heater, insulation, heat and radiation shields, among other things. Although the design particulars may vary depending upon the make and model of the crystal puller, in general, $G_0$ may be controlled using any of the means currently known in the art for controlling heat transfer at the melt/solid interface, including reflectors, radiation shields, purge tubes, light pipes, and heaters (side or bottom heaters). In general, radial variations in $G_0$ are minimized by, in most cases, positioning such an apparatus within about one crystal diameter above the melt/solid interface. $G_0$ can be controlled further by adjusting the position of the apparatus relative to the melt and crystal. This is accomplished either by adjusting the position of the apparatus in the hot zone, or by adjusting the position of the melt surface in the hot zone. In addition, when a heater is employed, $G_0$ may be further controlled by adjusting the power supplied to the heater. Any, or all, of these methods can be used during a batch Czochralski process in which melt volume is depleted during the process.

It is to be noted that, in accordance with the present invention, cooling is controlled through the temperature range over which nucleation of agglomerated vacancy defects occurs. Once this is achieved, as indicated by FIGS. 18–20 (and the discussion relating thereto), the cooling rate can be maintained (i.e., can be kept constant), or it can be increased.

In general, the single crystal silicon may be cooled through the nucleation temperature for agglomerated vacancy defects, and optionally the temperature at which vacancies are no longer mobile for commercially practical periods of time, by means of at least two alternative approaches. In the first approach, the entire ingot (or at least those portions of the ingot which are desired to possess the improved gate oxide integrity of the present invention) is maintained at a temperature in excess of the nucleation temperature until the ingot tail is completed. The ingot is then detached from the melt, the heat input to the hot zone is shut down, and the single crystal silicon is moved from the hot zone of the Czochralski reactor to a chamber separate from the hot zone, such as a crystal receiving or other cooling chamber, where the entire crystal (or at least those above-noted portions) can be cooled in accordance with the present invention. The cooling chamber may be jacketed with a heat exchanging device designed to utilize a cooling medium, for example cooling water, to remove heat from the cooling chamber at a rate sufficient to cool the single crystal silicon ingot at the desired rate, without directly contacting the single crystal silicon with the cooling medium. Alternatively, or in addition to using a cooling jacket, a pre-cooled gas such as, for example, helium may be used to continuously purge the crystal receiving or other cooling chamber to facilitate more rapid cooling. Methods for removing heat from a process vessel are well know in the art, such that persons skilled in the art could employ a variety of means for removing heat from the crystal receiving or other cooling chamber without requiring undue experimentation.

In a second approach, a portion, preferably a large portion, of the ingot is cooled during crystal growth. In this approach, the hot zone of the crystal puller is designed to (i) achieve a desired value (or range of values) for $v/G_0$ across the entire radius of the growing crystal, (ii) provide adequate diffusion of vacancy intrinsic point defects at temperatures intermediate of the temperature of solidification and the nucleation temperature for agglomerated intrinsic point defects, and (iii) cool the ingot through the nucleation temperature for agglomerated vacancy defects in the grown crystal by applying an appropriate axial temperature gradient over a range of temperatures containing the nucleation temperature, and optionally through the temperature at which vacancies no longer diffuse within a commercially practical period of time.

For an ingot prepared in accordance with the process of the present invention (i.e., an ingot containing material which is vacancy dominated), in some instances a low oxygen content material (i.e., less than about 13 PPMA (parts per million atomic, ASTM standard F-121–83), less than about 12 PPMA, less than about 11 PPMA oxygen, or even less than about 10 PPMA oxygen), may be preferred. This is because, in medium to high oxygen contents wafers (i.e., about 14 PPMA to about 18 PPMA), the formation of oxygen-induced stacking faults and bands of enhanced oxygen clustering may become more pronounced. Each of these are a potential source for problems in a given integrated circuit fabrication process.

The effects of enhanced oxygen clustering may be further reduced by a number of methods, used singularly or in combination. For example, oxygen precipitate nucleation centers typically form in silicon which is annealed at a temperature in the range of about 350° C. to about 750° C. For some applications, therefore, it may be preferred that the crystal be a "short" crystal, that is, a crystal which has been grown in a Czochralski process until the seed end has cooled from the melting point of silicon (about 1410° C.) to about 750° C. after which the ingot is rapidly cooled. In this way, the time spent in the temperature range critical for nucleation center formation is kept to a minimum and the oxygen precipitate nucleation centers have inadequate time to form in the crystal puller.

Preferably, however, oxygen precipitate nucleation centers formed during the growth of the single crystal are dissolved by annealing the single crystal silicon. Provided they have not been subjected to a stabilizing heat-treatment, oxygen precipitate nucleation centers can be annealed out of silicon by rapidly heating the silicon to a temperature of at least about 875° C., and preferably continuing to increase the temperature to at least 1000° C., at least 1100° C., 1200° C. or more. By the time the silicon reaches 1000° C., substantially all (e.g., >99%) of such defects have annealed out. It is important that the wafers be rapidly heated to these temperatures, i.e., that the rate of temperature increase be at least about 10° C. per minute and more preferably at least about 50° C. per minute. Otherwise, some or all of the oxygen precipitate nucleation centers may be stabilized by the heat-treatment. Equilibrium appears to be reached in relatively short periods of time, i.e., on the order of about 60 seconds or less. Accordingly, oxygen precipitate nucleation centers in the single crystal silicon may be dissolved by annealing it at a temperature of at least about 875° C., preferably at least about 950° C., and more preferably at least about 1100° C., for a period of at least about 5 seconds, and preferably at least about 10 minutes.

The dissolution may be carried out in a conventional furnace or in a rapid thermal annealing (RTA) system. The rapid thermal anneal of silicon may be carried out in any of a number of commercially available rapid thermal annealing ("RTA") furnaces in which wafers are individually heated by banks of high power lamps. RTA furnaces are capable of rapidly heating a silicon wafer, e.g., they are capable of heating a wafer from room temperature to 1200° C. in a few seconds. One such commercially available RTA furnace is the model 610 furnace available from AG Associates (Mountain View, Calif.). In addition, the dissolution may be carried out on silicon ingots or on silicon wafers, preferably wafers.

The atmosphere during the rapid thermal annealing and cooling steps is generally any non-oxidizing atmosphere; oxidation of the silicon surface has been found to suppress the vacancy concentration during the rapid thermal annealing step. Preferably, therefore, the atmosphere has a total absence of oxygen or a partial pressure of oxygen which is insufficient to inject sufficient quantities of silicon self-interstitial atoms which suppress the build-up of vacancy concentrations. While the lower limit of oxygen concentration at which the vacancy concentration is unacceptably suppressed has not been precisely determined, it is generally preferred that the atmosphere during the rapid thermal annealing step have less than 2,000 ppm (0.002 atm.) and more preferably less than about 1,000 ppm (0.001 atm.) of oxygen. The atmosphere may be, for example, a nitriding atmosphere such as nitrogen or ammonia, a non-nitriding atmosphere such as helium, neon, carbon dioxide or argon, or combinations thereof. Preferably, it is argon.

Substitutional carbon, when present as an impurity in single crystal silicon, has the ability to catalyze the formation of oxygen precipitate nucleation centers. For this and other reasons, therefore, it is preferred that the single crystal silicon ingot have a low concentration of carbon. That is, the concentration of carbon in the single crystal silicon is preferably less than about $5 \times 10^{16}$ atoms/cm$^3$, more preferably less than $1 \times 10^{16}$ atoms/cm$^3$, and still more preferably less than $5 \times 10^{15}$ atoms/cm$^3$.

Additionally, it is preferred in at least some embodiments that the single crystal silicon wafer be substantially free of nitrogen; that is, in some embodiments it is preferred that the wafers of the present invention be non-nitrogen doped. As used herein, the terms "non-nitrogen doped" and "substantially free of nitrogen" refers to silicon have a nitrogen content less than about $1 \times 10^{13}$ atoms/cm$^3$, $5 \times 10^{12}$ atoms/cm$^3$, $1 \times 10^{12}$ atoms/cm$^3$, $5 \times 10^{11}$ atoms/cm$^3$, or less.

Accordingly, the present, "non-nitrogen doped" wafers are distinguishable from wafers which are "nitrogen doped" because, if both are subjected to a heat treatment (e.g., rapid heating to about 1200° C. in the essential absence of oxygen), cooled, and then subjected to an oxygen precipitation heat treatment (e.g., heating to about 800° C. for about 4 hours and then to about 1000° C. for about 16 hours), the concentration of oxygen precipitates in the present "non-nitrogen doped" wafers will be less than about $1 \times 10^8$ per $cm^3$ (e.g., less than about $5 \times 10^7$, $1 \times 10^7$, $5 \times 10^6$, $1 \times 10^8$, or less), while the concentration of the "nitrogen doped" wafers will not.

It is to be noted that, as further described herein below, wafers which are sliced from ingots grown in accordance with the present invention are suitable for use as substrates upon which an epitaxial layer may be deposited. Epitaxial deposition may be performed by any means common in the art. Wafers which are sliced from ingots grown in accordance with the present invention are also suitable for use as substrates for semiconductor on insulator structures (e.g., SIMOX or bonded applications). The semiconductor on insulator composite may be formed, for example, as described in Iyer et al., U.S. Pat. No. 5,494,849. The present wafers may be employed in such applications as the substrate wafer or the device layer.

Furthermore, it is also to be noted that wafers prepared in accordance with the present invention are suitable for use in combination with hydrogen or argon annealing treatments, such as the treatments described in European Patent Application No. 503,816 A1.

Epitaxial Wafers

Generally speaking, silicon wafers prepared in accordance with the present invention are suitable for use as substrates upon which an epitaxial layer may be deposited. Homoepitaxial deposition may be performed by any means common in the art. In certain of these embodiments, however, control of void size and density are not narrowly critical because the epitaxial deposition process will "fill in" voids present at the wafer surface which would otherwise hinder gate oxide integrity; in these embodiments, the residual vacancy concentration would still be controlled to avoid excessive oxygen precipitation (as described in detail above in reference to "usable, functionally perfect" silicon).

Detection of Agglomerated Defects

Agglomerated defects may be detected by a number of different techniques. For example, flow pattern defects, or D-defects, are typically detected by preferentially etching the single crystal silicon sample in a Secco etch solution for about 30 minutes, and then subjecting the sample to microscopic inspection. (see, e.g., H. Yamagishi et al., *Semicond. Sci. Technol.* 7, A135 (1992)). Although standard for the detection of agglomerated vacancy defects, this process may also be used to detect agglomerated interstitial defects. When this technique is used, such defects appear as large pits on the surface of the sample when present.

Agglomerated defects may also be detected using laser scattering techniques, such as laser scattering tomography, which typically have a lower defect density detection limit that other etching techniques.

Additionally, agglomerated intrinsic point defects may be visually detect by decorating these defects with a metal capable of diffusing into the single crystal silicon matrix upon the application of heat. Specifically, single crystal silicon samples, such as wafers, slugs or slabs, may be visually inspected for the presence of such defects by first coating a surface of the sample with a composition containing a metal capable of decorating these defects, such as a concentrated solution of copper nitrate. The coated sample is then heated to a temperature between about 900° C. and about 1000° C. for about 5 minutes to about 15 minutes in order to diffuse the metal into the sample. The heat treated sample is then cooled to room temperature, thus causing the metal to become critically supersaturated and precipitate at sites within the sample matrix at which defects are present.

After cooling, the sample is first subjected to a non-defect delineating etch, in order to remove surface residue and precipitants, by treating the sample with a bright etch solution for about 8 to about 12 minutes. A typical bright etch solution comprises about 55 percent nitric acid (70% solution by weight), about 20 percent hydrofluoric acid (49% solution by weight), and about 25 percent hydrochloric acid (concentrated solution).

The sample is then rinsed with deionized water and subjected to a second etching step by immersing the sample in, or treating it with, a Secco or Wright etch solution for about 35 to about 55 minutes. Typically, the sample will be etched using a Secco etch solution comprising about a 1:2 ratio of 0.15 M potassium dichromate and hydrofluoric acid (49% solution by weight). This etching step acts to reveal, or delineate, agglomerated defects which may be present.

In an alternative embodiment of this "defect decoration" process, the single crystal silicon sample is subjected to a thermal anneal prior to the application of the metal-containing composition. Typically, the sample is heated to a temperature ranging from about 850° C. to about 950° C. for about 3 hours to about 5 hours. This embodiment is particularly preferred for purposes of detecting B-type silicon self-interstitial agglomerated defects. Without being held to a particular theory, it is generally believed that this thermal treatment acts to stabilize and grow B-defects, such that they may be more easily decorated and detected.

Measurement of Crystal Lattice Vacancies

The measurement of crystal lattice vacancies in single crystal silicon can be carried out by platinum diffusion analysis. In general, platinum is deposited on the samples and diffused in a horizontal surface with the diffusion time and temperature preferably being selected such that the Frank-Turnbull mechanism dominates the platinum diffusion, but which is sufficient to reach the steady-state of vacancy decoration by platinum atoms. For wafers having vacancy concentrations which are typical for the present invention, a diffusion time and temperature of 730° C. for 20 minutes may be used, although more accurate tracking appears to be attainable at a lesser temperature, e.g., about 680° C. In addition, to minimize a possible influence by silicidation processes, the platinum deposition method preferably results in a surface concentration of less than one monolayer.

Platinum diffusion techniques are described elsewhere, for example, by Jacob et al., *J. Appl. Phys.*, vol. 82, p. 182 (1997); Zimmermann and Ryssel, "The Modeling of Platinum Diffusion In Silicon Under Non-Equilibrium Conditions," *J. Electrochemical Society*, vol. 139, p. 256 (1992); Zimmermann, Goesele, Seilenthal and Eichiner, "Vacancy Concentration Wafer Mapping In Silicon," *Journal of Crystal Growth*, vol. 129, p. 582 (1993); Zimmermann and Falster, "Investigation Of The Nucleation of Oxygen Precipitates in Czochralski Silicon At An Early Stage," *Appl. Phys. Lett.*, vol. 60, p. 3250 (1992); and Zimmermann and Ryssel, *Appl. Phys. A*, vol. 55, p. 121 (1992); all of which are incorporated herein by reference.

Definitions

As used herein, the following phrases or terms shall have the given meanings: "agglomerated intrinsic point defects" mean defects caused by the reaction in which vacancies agglomerate to produce D-defects, flow pattern defects, gate oxide integrity defects, crystal originated particle defects, crystal originated light point defects, and other such vacancy related defects, or (ii) by the reaction in which self-interstitials agglomerate to produce dislocation loops and networks, and other such self-interstitial related defects; "agglomerated interstitial defects" shall mean agglomerated intrinsic point defects caused by the reaction in which silicon self-interstitial atoms agglomerate; "agglomerated vacancy defects" shall mean agglomerated vacancy point defects caused by the reaction in which crystal lattice vacancies agglomerate; "radius," in the context of a silicon wafer or ingot, means the distance measured from a central axis to a lateral surface of a wafer or ingot; "substantially free of agglomerated intrinsic point defects" shall mean a concentration of agglomerated defects which is less than the detection limit of these defects, which is currently about $10^3$ defects/cm$^3$; and, "vacancy dominated" and "self-interstitial dominated" mean material in which the intrinsic point defects are predominantly vacancies or self-interstitials, respectively.

Additionally, as used herein, the following phrases or terms shall have the given meanings: "residual vacancy concentration" refers to the vacancy concentration, as determined by means described herein, of the silicon material obtained for a single crystal silicon ingot grown in accordance with the present invention, after the ingot has been cooled below a temperature at which vacancies are no longer mobile for commercially practical periods of time (i.e., after void growth and/or vacancy diffusion to sites where they may be consumed or annihilated has stopped); and, "uncontrolled oxygen precipitation," as well as variations thereof, refers to oxygen precipitation which cannot be prevented or "erased" by thermal treatment typically used to dissolve pre-existing oxygen clusters or precipitate nucleii, such as by those methods described or referenced herein; more specifically, this refers to oxygen precipitation which cannot be dissolved by a thermal treatment wherein the silicon is rapidly heated (e.g., at a rate of at least 1° C./sec.) to a temperature not in excess of 1300° C. (e.g. a temperature of 1250° C., 1225° C., or even 1200° C.), as described in, for example, U.S. Pat. No. 5,994,761.

In view of the above, it will be seen that the several objects of the invention are achieved.

As various changes could be made in the above material and processes without departing from the scope of the invention, it is intended that all matter contained in the above description be interpreted as illustrative and not in a limiting sense.

What is claimed is:

1. A single crystal silicon wafer comprising a front surface, a back surface, a lateral surface joining the front and back surfaces, a central axis perpendicular to the front and back surfaces, and a segment which is axially symmetric about the central axis extending substantially from the front surface to the back surface in which crystal lattice vacancies are the predominant intrinsic point defect, the segment having a radial width of at least about 25% of the radius and containing agglomerated vacancy defects and a residual concentration of crystal lattice vacancies wherein (i) the agglomerated vacancy defects have a radius of less than about 70 nm, and an average void density of greater than $1\times10^7$ cm$^{-3}$ and (ii) the residual concentration of crystal lattice vacancy intrinsic point defects is less than the threshold concentration at which uncontrolled oxygen precipitation occurs upon subjecting the wafer to an oxygen precipitation heat treatment.

2. The wafer of claim 1 wherein the wafer is capable of having a concentration of oxygen precipitates of less than $1\times10^8$ cm$^{-3}$, upon being subjected to a rapid thermal anneal in which the wafer is rapidly heated to a temperature of 1200° C. in the essential absence of oxygen and then cooled, and then subjected to an oxygen precipitation heat treatment, consisting essentially of annealing said wafer at 800° C. for 4 hours and then at 1000° C. for 16 hours.

3. The wafer of claim 1 wherein said wafer has a nominal diameter of at least 200 mm.

4. The wafer of claim 1 wherein the segment has a width of at least 50% of the radius of the wafer.

5. The wafer of claim 1 wherein the segment has a width of at least 75% of the radius of the wafer.

6. The wafer of claim 1 wherein the segment has a width of at least 95% of the radius of the wafer.

7. The wafer of claim 1 wherein the agglomerated vacancy defects have an average radius of less than 60 nm.

8. The wafer of claim 1 wherein the agglomerated vacancy defects have an average radius of less than 50 nm.

9. The wafer of claim 1 wherein the agglomerated vacancy defects have an average radius of less than 40 nm.

10. The wafer of claim 1 wherein the agglomerated vacancy defects have an average radius of less than 30 nm.

11. The wafer of claim 1 wherein the average void density is greater than $5\times10^7$ cm$^{-3}$.

12. The wafer of claim 1 wherein the average void density is greater than $1\times10^8$ cm$^{-3}$.

13. The wafer of claim 1 wherein the oxygen content is less than 13 PPMA.

14. The wafer of claim 13 wherein the carbon concentration is less than $5\times10^{16}$ atoms/cm$^3$.

15. The wafer of claim 14 wherein the nitrogen content is less than $1\times10^{13}$ atoms/cm$^3$.

16. The wafer of claim 13 wherein the nitrogen content is less than $1\times10^{13}$ atoms/cm$^3$.

17. The wafer of claim 1 wherein the carbon concentration is less than $5\times10^{16}$ atoms/cm$^3$.

18. The wafer of claim 17 wherein the nitrogen content is less than $1\times10^{13}$ atoms/cm$^3$.

19. The wafer of claim 1 wherein the nitrogen content is less than $1\times10^{13}$ atoms/cm$^3$.

20. The wafer of any of claims 1–19 wherein the residual vacancy concentration is less than $3\times10^{12}$ cm$^{-3}$.

21. The wafer of claim 1 wherein the residual vacancy concentration is less than $2\times10^{12}$ cm$^{-3}$.

22. The wafer of claim 1 wherein the residual vacancy concentration is less than $1\times10^{12}$ cm$^{-3}$.

23. The wafer of claim 1 wherein the residual vacancy concentration is less than $5\times10^{11}$ cm$^{-3}$.

24. The wafer of claim 1 wherein the residual vacancy concentration is less than $1\times10^{11}$ cm$^{-3}$.

25. The wafer of claim 1 wherein the residual vacancy concentration is less than $5\times10^{10}$ cm$^{-3}$.

26. The wafer of claim 1 wherein the residual vacancy concentration is less than $1\times10^{10}$ cm$^{-3}$.

27. The wafer of claim 1 wherein the wafer has a homoepitaxial layer deposited on the front surface thereof.

* * * * *

UNITED STATES PATENT AND TRADEMARK OFFICE
CERTIFICATE OF CORRECTION

PATENT NO. : 6,986,925 B2 Page 1 of 1
APPLICATION NO. : 10/039196
DATED : January 17, 2006
INVENTOR(S) : Robert J. Falster et al.

It is certified that error appears in the above-identified patent and that said Letters Patent is hereby corrected as shown below:

On the Title Page of the Patent
(60) Related U.S. Application Data, "Jan. 2, 2002." should read -- Jan. 2, 2001. --.

Signed and Sealed this

Twenty-eighth Day of August, 2007

JON W. DUDAS
*Director of the United States Patent and Trademark Office*